(12) United States Patent  (10) Patent No.: US 6,963,093 B2
Yamada  (45) Date of Patent: Nov. 8, 2005

(54) SOLID-STATE IMAGING DEVICE AND METHOD FOR PRODUCING THE SAME

(75) Inventor: Tohru Yamada, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 5 days.

(21) Appl. No.: 10/625,302

(22) Filed: Jul. 22, 2003

(65) Prior Publication Data

US 2004/0129956 A1 Jul. 8, 2004

(30) Foreign Application Priority Data

Jul. 23, 2002 (JP) .................................... 2002-214438

(51) Int. Cl.[7] ............................................. H01L 27/148
(52) U.S. Cl. ..................... 257/229; 257/225; 257/231; 257/232; 438/60
(58) Field of Search ............................. 257/229, 225, 257/231, 232; 438/60

(56) References Cited

U.S. PATENT DOCUMENTS

| 5,742,081 | A | * | 4/1998 | Furumiya .................... 257/232 |
| 6,114,717 | A | * | 9/2000 | Uchiya ....................... 257/232 |
| 6,278,487 | B1 | * | 8/2001 | Nakashiba ................... 348/314 |

FOREIGN PATENT DOCUMENTS

| JP | 5-29599 | 2/1993 |
| JP | 6-318691 | 11/1994 |
| JP | 9-237886 | 9/1997 |
| JP | 10-135439 | 5/1998 |

* cited by examiner

*Primary Examiner*—Jerome Jackson
(74) *Attorney, Agent, or Firm*—Hamre, Schumann, Mueller & Larson, P.C.

(57) ABSTRACT

A solid-state imaging device includes a plurality of vertical charge transferring portions, and a horizontal charge transferring portion connected to at least one end of each of the vertical charge transferring portions. A vertical transfer channel region of a first conductivity, an element isolating region of a second conductivity and a vertical well region of the second conductivity that constitute the vertical charge transferring portion are extended up to the connection portion between the vertical charge transferring portions and the horizontal charge transferring portion, and the end portions of the extended regions of the vertical transfer channel region of the first conductivity and the vertical well region of the second conductivity on the side of the horizontal charge transferring portion are positioned more on the side of the horizontal charge transferring portion than the end portion of the final vertical transfer electrode on the side of the horizontal charge transferring portion, and are positioned within 1.5 $\mu$m from the end portion of the element isolating region of the second conductivity on the side of the horizontal charge transferring portion.

10 Claims, 17 Drawing Sheets

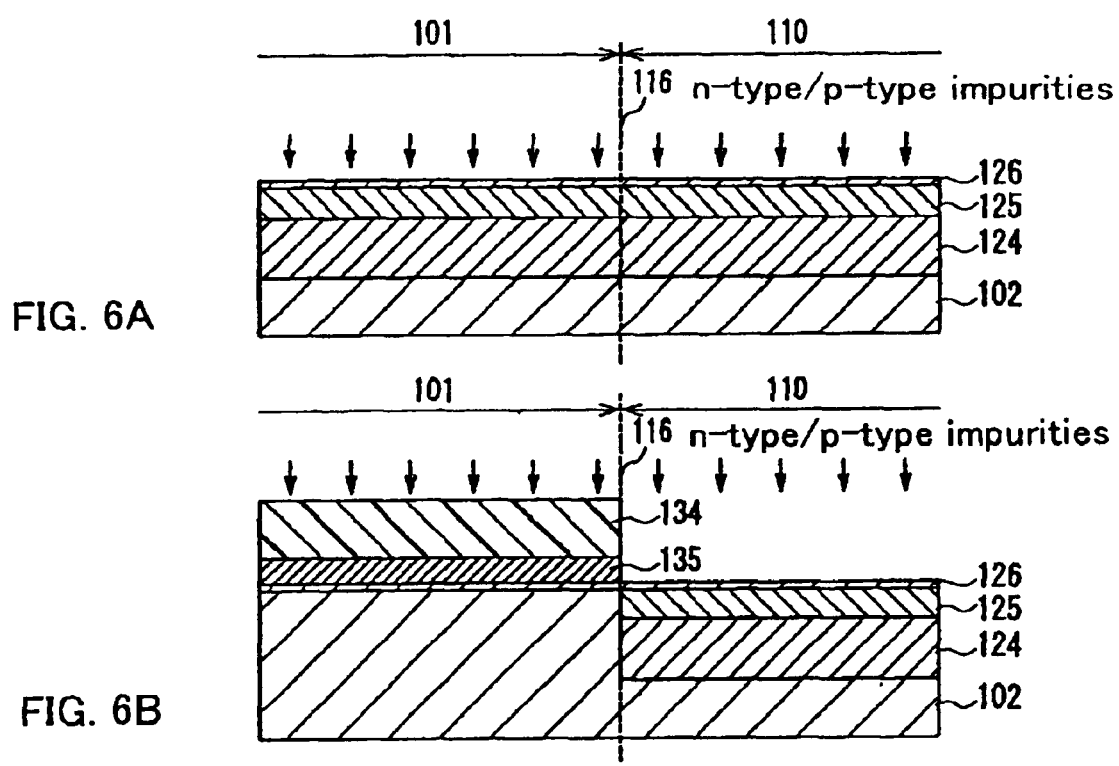

SOLID-STATE IMAGING DEVICE AND METHOD FOR PRODUCING THE SAME

BACKGROUND OF THE INVENTION

1. Field of the Invention

The present invention relates to a solid-state imaging device including a plurality of vertical charge transferring portions and a horizontal charge transferring portion connected to one end or both ends of the vertical charge transferring portions, and a method for producing the same.

2. Description of the Related Art

An interline-transfer solid-state imaging device includes a plurality of photoelectric exchanging portions arranged in a matrix, a plurality of arrays of vertical charge transferring portions arranged corresponding to each array of the photoelectric exchanging portions, a horizontal charge transferring portion electrically connected to one end of each vertical charge transferring portion, and an output circuit portion connected to one end of the horizontal charge transferring portion. In such a solid-state imaging device, signal charges generated in the photoelectric exchanging portions are transferred in the vertical direction by the vertical charge transferring portions and then to the horizontal charge transferring portion. In the horizontal transferring portion, the signal charges are transferred in the horizontal direction (direction orthogonal to the transfer direction of the vertical charge transferring portions) to the output circuit portion.

The conventional structure of the connection portion between the vertical charge transferring portions and the horizontal charge transferring portion of such a solid-state imaging device is described, for example, in JP 5-29599A and JP 10-135439 A. FIGS. 19A and 19B are schematic views showing the structure in the vicinity of the connection portion between the vertical charge transferring portions and the horizontal charge transferring portion of the conventional interline-transfer solid-state imaging device. FIG. 19A is a plan view and FIG. 19B is a cross-sectional view taken along line A–A' of the FIG. 19A.

In the vertical charge transferring portion 501, a vertical p-type well 503 is formed in a surface layer portion of an n⁻⁻⁻-type semiconductor substrate 502, and an n-type vertical transfer channel 504 is formed in the surface layer portion of the vertical p-type well 503. A plurality of vertical transfer electrodes 507, 509a, and 509b and a final vertical transfer electrode 508 are formed on the surface of the n⁻⁻⁻-type semiconductor substrate 502 via a gate insulating film 506. The vertical transfer electrodes are wired such that a clock pulse $\phi$V1, $\phi$V2, $\phi$V3, or $\phi$V4 is applied to the vertical transfer electrodes. In the vertical charge transferring portion 501, a p⁺-type element separating region 505 for electrically separating between the vertical transfer channels 504 is formed.

In the horizontal charge transferring portion 510, a horizontal p-type well 511 is formed in a surface layer portion of the n⁻⁻⁻-type semiconductor substrate 502, and an n-type horizontal transfer channel 512 is formed in the surface layer portion of the horizontal p-type well 511. A plurality of first horizontal transfer electrodes 513a and 513b are formed on the surface of the n⁻⁻⁻-type semiconductor substrate 502 via the gate insulating film 506. Furthermore, an n⁻-type potential barrier region 514 is formed in a gap between the first horizontal transfer electrodes and a gap between the final vertical transfer electrode 508 and the first horizontal transfer electrode 513a, and second horizontal transfer electrodes 515a and 515b are formed on the potential barrier region 514 via the gate insulating film 506. The horizontal transfer electrodes are wired such that a clock pulse $\phi$H1 or $\phi$H2 is applied to the horizontal transfer electrodes.

In the connection portion between the vertical charge transferring portion 501 and horizontal charge transferring portion 510, the p⁺-type element separating region 505 extends from the side of the vertical charge transferring portion 501. In this connection portion, the horizontal transfer channel 512 extends from the horizontal charge transferring portion 510 side. The portion of the horizontal transfer channel 512 that extends in the connection portion is placed between the p⁺-type element separating regions 505. On the other hand, the vertical transfer channel 504 does not extend in the connection portion, and the end portion 521 thereof on the side of the horizontal charge transferring portion substantially matches the end portion of the final vertical transfer electrode 508. In this connection portion, the n⁻-type potential barrier region 514 is formed on a portion corresponding to the boundary between the vertical transfer channel 504 and the horizontal transfer channel 512.

The channel width of the vertical transfer channel 504 is narrower than that of the horizontal transfer channel 512, and therefore the impurity concentration of the vertical transfer channel 504 is higher than that of the horizontal transfer channel 512 in order to ensure the amount of transfer signals. Since the horizontal charge transferring portion 510 has a higher transfer frequency than that of the vertical charge transferring portion 501, the p-type impurity concentration of the horizontal p-type well 511 is lower than that of the vertical p-type well 503 so as to intensify the transfer electric field.

Next, the charge transfer operation from the vertical charge transferring portion to the horizontal charge transferring portion will be described with reference to FIGS. 20 and 21. FIG. 21 shows an example of clock pulses that are applied to the electrodes of the vertical charge transferring portions and the horizontal charge transferring portion. FIG. 20 is a diagram showing a potential distribution during charge transfer from the vertical charge transferring portion to the horizontal charge transferring portion when they are driven by the clock pulses shown in FIG. 21. In the potential diagram, it is assumed that the downward potential is positive and charges are held in a hatched portion (which also applies to the following).

At a time t1, the signal charge 517 in the vertical charge transferring portion 501 is accumulated below the first vertical transfer electrode 507 and the second vertical transfer electrode 509b to which a high voltage $V_{VH}$ is applied. Next, at a time t2, the clock pulse $\phi$V4 changes from $V_{VL}$ to $V_{VH}$, and the clock pulse $\phi$V2 changes from $V_{VH}$ to $V_{VL}$, so that a part of the signal charge 517 is started to be transferred from the vertical charge transferring portion 501 to the horizontal charge transferring portion 510. Then, at a time t3, the dock pulse $\phi$V1 changes from $V_{VL}$ to $V_{VH}$, and the dock pulse $\phi$V3 changes from $V_{VH}$ to $V_{VL}$, so that the signal charge 517 further is transferred from the vertical charge transferring portion 501 to the horizontal charge transferring portion 510. At a time t4, the clock pulse $\phi$V2 changes from $V_{VL}$ to $V_{VH}$, and the clock pulse $\phi$V4 changes from $V_{VH}$ to $V_{VL}$, and thus the operation of the transfer of the signal charge 517 from the vertical charge transferring portion 501 to the horizontal charge transferring portion 510 is completed. At this point, the signal charge 517 is accumulated in the first horizontal transfer electrode 513a to which $V_{HH}$ of the horizontal charge transferring portion 510 is applied. Furthermore, the next signal charge 518 has been transferred up to a portion below the first vertical transfer electrode 507 and the second vertical transfer electrode 509a to which a high voltage $V_{VH}$ is applied. At a time t5, the clock pulse φV3 changes from $V_{VL}$ to $V_{VH}$, and the clock pulse φV1 changes from $V_{VH}$ to $V_{VL}$, so that the next signal charge 518 is transferred up to a portion below the first vertical transfer electrode 507 and the second vertical transfer electrode 509b to which a high voltage $V_{VH}$ is applied. Thereafter, the horizontal charge transferring portion 510 is operated so that transfer pulses φH1 and φH2 that have opposite phases to each other are applied to the horizontal transfer electrodes, and the signal charge 517 is transferred in the horizontal charge transferring portion. Thereafter, by repeating this operation, the signal charge 517 is transferred in the vertical charge transferring portion 501 and the horizontal charge transferring portion 510.

As shown in FIG. 20, in the connection portion between the vertical charge transferring portion and the horizontal charge transferring portion, a potential barrier 519 is present because of the potential barrier region 514 formed below the second horizontal transfer electrode 515a, and further a potential barrier 520 is present as a result of a narrow channel effect caused by the element isolating region 505 of the vertical charge transferring portion. Therefore, the reverse transfer of the signal charge from the horizontal charge transferring portion to the vertical charge transferring portion is prevented.

Next, a method for producing the solid-state imaging device will be described. FIGS. 22A, 22B, 23A, 23B, 24A, 24B, 25A and 25B are views for illustrating a method for producing the solid-state imaging device. FIGS. 22A, 23A, 24A and 25A show portions corresponding to the cross sections taken along line A–A' of FIG. 19A, and FIGS. 22B, 23B, 24B and 25B show portions corresponding to the cross sections taken along line B–B' of FIG. 19A.

First, as shown in FIGS. 22A and 22B, a protective film 526 is formed on the surface of the n⁻⁻⁻-type semiconductor substrate 502, and the element isolating region 505 is formed by implanting ions of p-type impurities such as boron in a region other than the regions in which a vertical transfer channel and a horizontal transfer channel are to be formed in the surface layer portion of the n⁻⁻⁻-type semiconductor substrate 502. Then, a first photoresist film 534 is formed on the surface of the protective film 526, and the first photoresist film 534 is removed from the regions in which a vertical transfer channel and a horizontal transfer channel are to be formed, and then a p-type region 524 is formed by implanting ions of p-type impurities such as boron in the surface layer portion of the n⁻⁻⁻-type semiconductor substrate 502. An n-type region 525 is formed by implanting ions of n-type impurities such as phosphorus or arsenic in the surface layer portion of the p-type region 524.

Then, after the first photoresist film 534 is removed entirely, as shown in FIGS. 23A and 23B, a second photoresist film 528 is formed on the surface of the protective film, and the second photoresist film 528 is removed from the region in which a vertical transfer channel is to be formed, and then a vertical p-type well 503 is formed by implanting ions of p-type impurities such as boron in substantially the same depth as the p-type region 524, and a vertical transfer channel 504 is formed by implanting ions of n-type impurities such as phosphorus or arsenic in substantially the same depth as the n-type region 525. Here, the portions of the p-type region 524 and the n-type region 525 in which the vertical p-type well 503 and the vertical transfer channel 504 are not formed serve as the horizontal p-type well 511 and the horizontal transfer channel 512, respectively.

Then, after the second photoresist film 528 and the protective film 526 are removed entirely, as shown in FIGS. 24A and 24B, the gate insulating film 506 is formed, and transfer electrodes 507, 508, 513a and 513b of the first layer are formed on the gate insulating film 506. Then, a third photoresist film 529 is formed on the surface thereof. After this film is removed from the region on the side of the horizontal transfer channel such that the boundary is on the final vertical transfer electrode 508, the n⁻-type potential barrier region 514 is formed by implanting ions of p-type impurities such as boron.

Then, after the third photoresist film 529 is removed entirely, as shown in FIGS. 25A and 25B, an interlayer insulating film 527 is formed around the transfer electrodes 507, 508, 513a and 513b of the first layer, and then transfer electrodes 509a, 509b, 515a and 515b of the second layer are formed. Wiring is performed by metal films such as aluminum or tungsten such that clock pluses φV1, φV2, φV3, and φV4 can be applied to the vertical transfer electrode 509a, 507, 509b and 508, and that clock pluses φH and φH2 can be applied to a pair of horizontal transfer electrodes 513a and 515a, and a pair of horizontal transfer electrodes 513b and 515b. Thus, the conventional solid-state imaging device can be produced.

However, in the conventional solid-state imaging device, the charge transfer from the vertical charge transferring portion to the horizontal charge transferring portion cannot be performed smoothly in a sufficiently short time as the miniaturization of pixels, the high-speed driving of the vertical charge transferring portion and the low voltage driving of the horizontal charge transferring portion are promoted, and abnormal display such as appearance of vertical lines generally called black line defects occurs, or the transfer efficiency is deteriorated significantly. The reasons why these problems occur will be described with reference to FIG. 20.

In the conventional solid-state imaging device, with the miniaturization of pixels, the channel width of the vertical transfer channel 504 should be decreased, so that it is necessary to increase the n-type impurity concentration of the vertical transfer channel 504 in order to ensure the amount of transfer charges. On the other hand, it is not necessary to decrease the channel width of the horizontal transfer channel 512, so that it is not necessary to increase the n-type impurity concentration of the horizontal transfer channel 512.

Furthermore, in the conventional solid-state imaging device, the end portion 521 of the vertical transfer channel 504 on the side of the horizontal charge transferring portion is formed so as to substantially match the end portion of the final vertical transfer electrode 508, and the potential barrier region 514 and the horizontal transfer channel 512 are formed more on the side of the horizontal charge transferring portion than the end portion of the final vertical transfer electrode 508. In other words, the vertical transfer channel 504 having a high n-type impurity concentration is formed below the final vertical transfer electrode 508, and the horizontal transfer channel 512 having a low n-type impurity concentration is formed in a region below the first horizontal transfer electrode 513a and the second horizontal transfer electrode 515a in the connection portion between the vertical charge transferring portion 501 and the horizontal charge transferring portion 510.

Therefore, when the n-type impurity concentration difference between the vertical transfer channel 504 and the horizontal transfer channel 512 is increased or the low voltage driving of the horizontal charge transferring portion is promoted, the channel potential below the second horizontal transfer electrode 515a and the first horizontal transfer electrode 513a (to which $V_{HH}$ is applied) in the connection portion is formed in a smaller depth than the channel potential below the final vertical transfer electrode 508 (to which $V_{VH}$ is applied). Thus, the transfer barrier 523 is formed at times t2 and t3 in FIG. 20. As a result, all the signal charges 517a and 517b left in the vertical charge transferring portion 501 cannot be transferred to the horizontal charge transferring portion 510 in a short time from a time t4 to a time of the start of operation of the horizontal charge transferring portion, and untransferred signal charges 522 are generated and abnormal display such as the appearance of vertical lines called black line defects may occur.

In order not to generate the transfer barrier 523 as described above, the final vertical transfer electrode 508 is formed independently of other vertical transfer electrodes to which φV4 is applied, and a clock pulse φV4' with a lower voltage than the high level voltage $V_{VH}$ can be applied to the final vertical transfer electrode 508. In this case, however, poor transfer occurs anew from the second vertical transfer electrode 509b to the final vertical transfer electrode 508, and a separate power source for generating the clock pulse φV4' is required so that a driving circuit becomes complicated.

In the method for producing the conventional solid-state imaging device as described above, with the miniaturization of pixels, a variation in the amount of transfer charge in the vertical charge transferring portion is increased because of displacement of mask alignment. The reason why this problem occurs will be described with reference to FIG. 22.

The vertical transfer channel 504 and the vertical p-type well 503 are formed, as described above, by implanting ions of n-type impurities and p-type impurities after the first photoresist film 534 is patterned and removed [FIGS. 22A and 22B], then by implanting ions of n-type impurities and p-type impurities after the second photoresist film 528 is patterned and removed [FIGS. 23A and 23B]. Thus, the vertical transfer channel 504 and the vertical p-type well 503 are formed in two photoresist processes, so that the displacement of the mask alignment between the first photoresist process and the second photoresist process may cause variation in the width of the vertical transfer channel 504 or the vertical p-type well 503 to be formed. As a result, in particular, as the size of the pixels is decreased, a variation in the amount of transfer charge in the vertical charge transferring portion is increased.

SUMMARY OF THE INVENTION

Therefore, with the foregoing in mind, it is an object of the present invention to provide a solid-state imaging device that can ensure a sufficient amount of transfer charge in each of the vertical charge transferring portions and reduce sufficiently untransferred signal charges that occur when transferring the signal charges from each of the vertical charge transferring portions to the horizontal charge transferring portion and thus can be provided with good display characteristics, even if the miniaturization of pixels or the low voltage driving in the horizontal charge transferring portion are promoted, and a method for producing such a solid-state imaging device with a high precision.

In order to achieve the above object, a solid-state imaging device of the present invention includes a plurality of vertical charge transferring portions, and a horizontal charge transferring portion that is connected to at least one end of each of the vertical charge transferring portions, receives charges transferred from each of the vertical charge transferring portions and transfers the charges. Each of the vertical charge transferring portions includes a vertical transfer channel region of a first conductivity, an element isolating region of a second conductivity formed so as to be adjacent to the vertical transfer channel region of the first conductivity, a plurality of vertical transfer electrodes and a final vertical transfer electrode formed on the vertical transfer channel region of the first conductivity, and a vertical well region of the second conductivity formed below the vertical transfer channel region of the first conductivity. The horizontal charge transferring portion includes a horizontal transfer channel region of a first conductivity, and a plurality of horizontal transfer electrodes formed on the horizontal transfer channel region of the first conductivity, and a horizontal well region of the second conductivity formed below the horizontal transfer channel region of the first conductivity. In a connection portion between each of the vertical charge transferring portions and the horizontal charge transferring portion, the vertical transfer channel region of the first conductivity, the element isolating region of the second conductivity and the vertical well region of the second conductivity extend from each of the vertical charge transferring portions, and a part of the horizontal transfer electrodes is overlapped on a portion of the vertical transfer channel region of the first conductivity that extends in the connection portion. The end portions of the portions of the vertical transfer channel region of the first conductivity and the vertical well region of the second conductivity that extend in the connection portion on the side of the horizontal charge transferring portion are positioned more on the side of the horizontal charge transferring portion than an end portion of the final vertical transfer electrode on the side of the horizontal charge transferring portion, and are positioned within 1.5 μm from the end portion of the element separating isolating region of the second conductivity on the side of the horizontal charge transferring portion.

Furthermore, a first production method of the present invention is a method for producing the solid-state imaging device of the present invention and includes forming an ion implantation blocking film on a semiconductor substrate; forming a first photoresist film on the ion implantation blocking film, patterning the first photoresist film and the ion implantation blocking film such that the first photoresist film and the ion implantation blocking film are left on a region to be formed into an element isolating region of a second conductivity and are removed from a region to be formed into a vertical transfer channel region of a first conductivity and a horizontal transfer channel region of the first conductivity; forming the vertical transfer channel region of the first conductivity and the horizontal transfer channel region of the first conductivity by implanting ions of impurities of the first conductivity in a surface layer of the semiconductor substrate, and forming a vertical well region of the first conductivity and a horizontal well region of the first conductivity by implanting ions of impurities of the second conductivity below the vertical transfer channel region of the first conductivity and the horizontal transfer channel region of the first conductivity, using the first photoresist film and the ion implantation blocking film as a mask; removing the first photoresist film and then forming a second photoresist film on the semiconductor substrate; patterning the second photoresist film such that the second photoresist is left on the horizontal transfer channel region of the first conductivity and removed from the vertical transfer channel region of the first conductivity; and implanting further ions of impurities of the first conductivity in the vertical transfer channel region of the first conductivity, using the second photoresist film and die ion implantation blocking film as a mask.

Furthermore, a second production method of the present invention is a method for producing the solid-state imaging device of the present invention and includes forming an ion implantation blocking film on a semiconductor substrate; forming a first photoresist film on the ion implantation blocking film; patterning the first photoresist film and the ion implantation blocking film such that the first photoresist film and the ion implantation blocking film at left on a region to be formed into an element isolating region of a second conductivity and are removed from a region to be formed into a vertical transfer channel region of a first conductivity and a horizontal transfer channel region of the first conductivity; forming the vertical transfer channel region of the first conductivity and the horizontal transfer channel region of the first conductivity by implanting ions of impurities of the first conductivity in a surface layer of the semiconductor substrate using the first photoresist film and the ion implantation blocking film as a mask, removing the first photoresist film and then forming a second photoresist film on the semiconductor substrate; patterning the second photoresist film such that the second photoresist is left on the horizontal transfer channel region of the first conductivity and removed from at least the vertical transfer channel region of the first conductivity; forming a vertical well region of the second conductivity by implanting further ions of impurities of the first conductivity in the vertical transfer channel region and implanting ions of impurities of the second conductivity below the vertical transfer channel region, using the second photoresist film and die ion implantation blocking film as a mask; removing the second photoresist film and the ion implantation blocking film and then forming a third photoresist film on the semiconductor substrate; patterning the third photoresist film such that the third photoresist film is left at least on the vertical transfer channel region of the first conductivity and removed from the horizontal transfer channel region of the first conductivity; and forming a vertical well region of the second conductivity by implanting ions of impurities of the second conductivity below the horizontal transfer channel region, using the third photoresist film as a mask.

Further, a third production method of the present invention is a method for producing the solid-state imaging device of the present invention and includes forming a first photoresist film on a semiconductor substrate; patterning the first photoresist film such that the first photoresist film is left on a region to be formed into an element isolating region of a second conductivity and is removed from a region to be formed into a vertical transfer channel region of a first conductivity and a horizontal transfer channel region of the first conductivity; forming the vertical transfer channel region of the first conductivity and the horizontal transfer channel region of rite first conductivity by implanting ions of impurities of the first conductivity in a surface layer of the semiconductor substrate using the first photoresist film as a mask, and forming a vertical well region of the first conductivity and a horizontal well region of the first conductivity by implanting ions of impurities of the second conductivity below the vertical transfer channel region of the first conductivity and the horizontal transfer channel region of the first conductivity; removing the first photoresist film and then forming a second photoresist film on the semiconductor substrate; patterning the second photoresist film such that the second photoresist is left on a region to be formed into an element isolating region of the second conductivity and the horizontal transfer channel region of the first conductivity and is removed from the horizontal transfer channel region of the first conductivity, and implanting further ions of impurities of the second conductivity in the horizontal transfer channel region of the first conductivity, using the second photoresist film as a mask In the third production method, it is preferable that the method further includes implanting ions of impurities of the first conductivity in the horizontal well region of the second conductivity, using the second photoresist film as a mask.

According to the solid-state imaging device of the present invention, even if the difference in the n-type impurity concentration between each of the vertical transfer channels and the horizontal transfer channel is increased in order to increase the amount of transfer charge of each of the vertical charge transferring portions or the low voltage driving of the horizontal charge transferring portion is promoted, the signal charges can be transferred to the horizontal charge transferring portion smoothly in a short time. Consequently, the miniaturization of pixels, the high-speed driving of each of the vertical charge transferring portions and the low voltage driving of the horizontal charge transferring portion can be promoted.

BRIEF DESCRIPTION OF THE DRAWINGS

FIG. 2A is a plan view thereof and FIG. 2B is a cross-sectional view taken along line A–A' of FIG. 2A.

FIGS. 6A and 6B are schematic views illustrating a first example of a method for producing the solid-state imaging device of the first embodiment; and FIG. 6A shows a portion corresponding to the cross section taken along line A–A' of FIG. 2A, and FIG. 6B shows a portion corresponding to the cross section taken along line B–B' of FIG. 2A.

FIG. 7A shows a portion corresponding to the cross section taken along line A–A' of FIG. 2A, and FIG. 7B shows a portion corresponding to the cross section taken along line B–B' of FIG. 2A.

FIG. 8A shows a portion corresponding to the cross section taken along line A–A' of FIG. 2A, and FIG. 8B shows a portion corresponding to the cross section taken along line B–B' of FIG. 2A.

FIG. 9A shows a portion corresponding to the cross section taken along line A–A' of FIG. 2A, and FIG. 9B shows a portion corresponding to the cross section taken along line B–B' of FIG. 2A.

FIG. 10A shows a portion corresponding to the cross section taken along line A–A' of FIG. 2A, and FIG. 10B shows a portion corresponding to the cross section taken along line B–B' of FIG. 2A.

FIG. 11A shows a portion corresponding to the cross section taken along line A–A' of FIG. 2A, and FIG. 11B shows a portion corresponding to the cross section taken along line B–B' of FIG. 2A.

FIG. 12A shows a portion corresponding to the cross section taken along line A–A' of FIG. 2A, and FIG. 12B shows a portion corresponding to the cross section taken along line B–B' of FIG. 2A.

FIG. 13A shows a portion corresponding to the cross section taken along line A–A' of FIG. 2A, and FIG. 13B shows a portion corresponding to the cross section taken along line B–B' of FIG. 2A.

FIG. 14A shows a portion corresponding to the cross section taken along line A–A' of FIG. 2A, and FIG. 14B shows a portion corresponding to the cross section taken along line B–B' of FIG. 2A.

FIG. 15A shows a portion corresponding to the cross section taken along line A–A' of FIG. 2A, and FIG. 15B shows a portion corresponding to the cross section taken along line B–B' of FIG. 2A.

FIG. 16A shows a portion corresponding to the cross section taken along line A–A' of FIG. 2A, and FIG. 16B shows a portion corresponding to the cross section taken along line B–B' of FIG. 2A.

FIG. 17A shows a portion corresponding to the cross section taken along line A–A' of FIG. 2A, and FIG. 17B shows a portion corresponding to the cross section taken along line B–B' of FIG. 2A.

FIG. 18A shows a portion corresponding to the cross section taken along line A–A' of FIG. 2A, and FIG. 18B shows a portion corresponding to the cross section taken along line B–B' of FIG. 2A.

FIG. 19A is a plan view thereof and FIG. 19B is a cross-sectional view taken along line A–A' of FIG. 19A.

FIG. 22A shows a portion corresponding to the cross section taken along line A–A' of FIG. 19A, and FIG. 22B shows a portion corresponding to the cross section taken along line B–B' of FIG. 19A.

FIG. 23A shows a portion corresponding to the cross section taken along line A–A' of FIG. 19A, and FIG. 23B shows a portion corresponding to the cross section taken along line B–B' of FIG. 19A.

FIG. 24A shows a portion corresponding to the cross section taken along line A–A' of FIG. 19A, and FIG. 24B shows a portion corresponding to the cross section taken along line B–B' of FIG. 19A.

FIG. 25A shows a portion corresponding to the cross section taken along line A–A' of FIG. 19A, and FIG. 25B shows a portion corresponding to the cross section taken along line B–B' of FIG. 19A.

DESCRIPTION OF THE PREFERRED EMBODIMENTS

Figure 1:
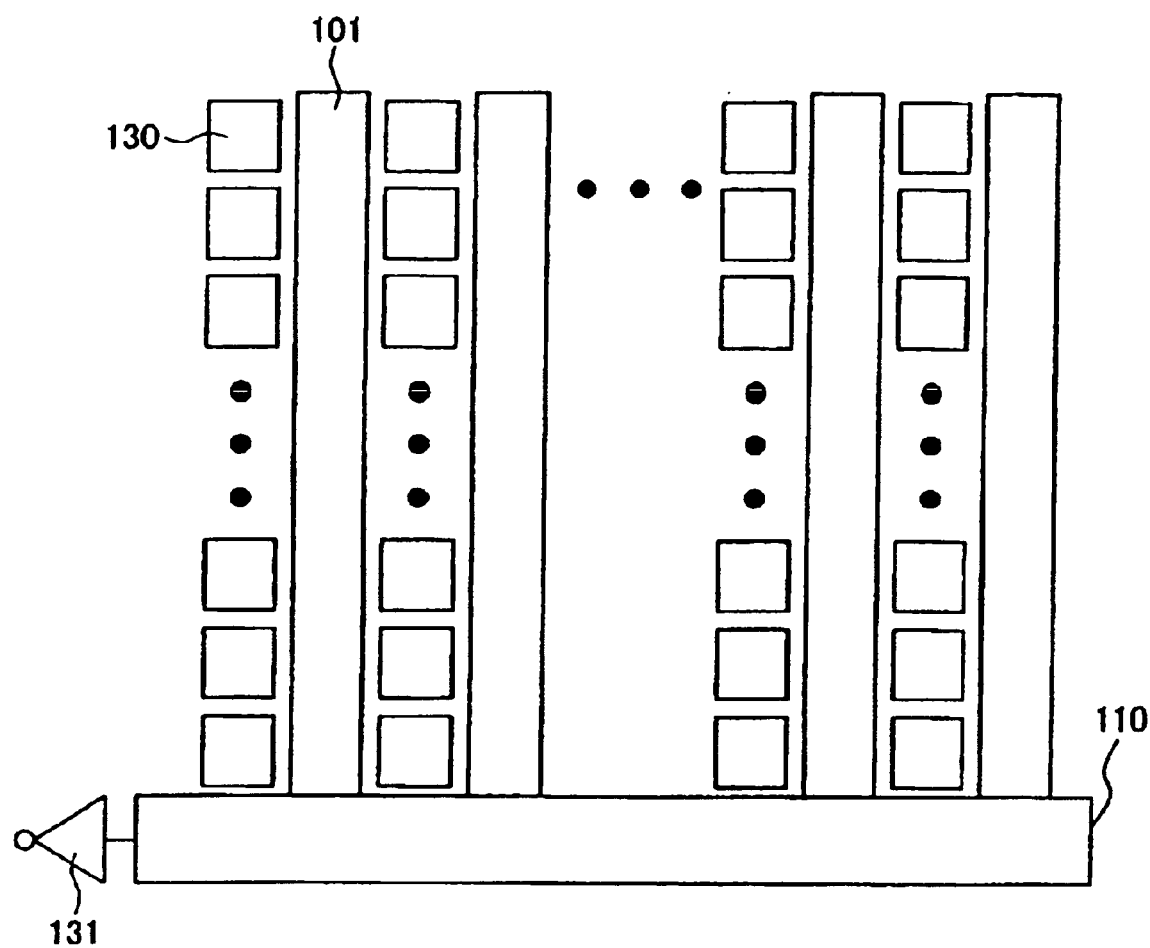
FIG. 1 is a schematic view showing an example of a solid-state imaging device of a first embodiment.

According to the solid-state imaging device of the present invention, as described above, the vertical transfer channel region of a first conductivity, the element isolating region of a second conductivity and the vertical well region of the second conductivity are extended to the connection portion between each of the vertical charge transferring portions and the horizontal charge transferring portion, and the end portions of the extended portions of the vertical transfer channel region of the first conductivity and the vertical well region of the second conductivity on the side of the horizontal charge transferring portion are positioned more on the side of the horizontal charge transferring portion than the end portion of the final vertical transfer electrode on the side of the horizontal charge transferring portion, and are positioned within 1.5 µm from the end portion of the element isolating region of the second conductivity on the side of the horizontal charge transferring portion. Thus, even if the difference in the n-type impurity concentration between tile vertical transfer channel and the horizontal transfer channel is increased in order to increase the amount of transfer charge of each of the vertical charge transferring portions or the low voltage driving of the horizontal charge transferring portion is promoted, signal charges can be transferred to the horizontal charge transferring portion smoothly in a short nine. Therefore, the miniaturization of pixels, the high-speed driving of each of the vertical charge transferring portions and the low voltage driving of the horizontal charge transferring portion can be promoted further while ensuring good display characteristics.

In the solid-state imaging device, it is preferable that the horizontal transfer channel region of the first conductivity is formed so as to have a lower impurity concentration than that of the vertical transfer channel region of the first conductivity. According to this preferable example, even if the channel width of the vertical transfer channel region is decreased with the miniaturization of pixels, a sufficient amount of transfer signals can be ensured.

In the solid-state imaging device, it is preferable that the horizontal transfer channel region of the first conductivity is formed so as to have a larger diffusion depth than that of the vertical transfer channel region of the first conductivity. According to this preferable example, the electric field in the horizontal transfer channel region from the horizontal transfer electrodes extends up to a deep portion, and therefore the transfer electric field is intensified and the transfer efficiency in the horizontal charge transferring portion is improved further.

In the solid-state imaging device, it is preferable that the horizontal well region of the second conductivity is formed so as to have a lower impurity concentration than that of the vertical well region of the second conductivity. According to this preferable example, the electric field in the horizontal transfer channel region from the horizontal transfer electrodes extends up to a deep portion, and therefore the transfer electric field is intensified and the transfer efficiency in the horizontal charge transferring portion is improved further. In addition, since the channel potential of the horizontal transfer channel region is formed deeper than that of the vertical transfer channel region, signal charges can be transferred from the vertical charge transferring portion to the horizontal charge transferring portion even more smoothly.

In the solid-state imaging device, it is preferable that the horizontal well region of the second conductivity is formed so as to have a larger diffusion depth than that of the vertical well region of the second conductivity. According to this preferable example, the electric field in the horizontal transfer channel region from the horizontal transfer electrodes extends up to a deep portion, and therefore the transfer electric field is intensified and the transfer efficiency in the horizontal charge transferring portion is improved further. In addition, since the channel potential of the horizontal transfer channel region is formed deeper than that of the vertical transfer channel region, signal charges can be transferred from the vertical charge transferring portion to the horizontal charge transferring portion even more smoothly.

In the solid-state imaging device, it is preferable that the impurity concentrations of the vertical transfer channel region of the first conductivity and the horizontal transfer channel region of the first conductivity are set such that, with respect to the horizontal transfer electrodes arranged so as to overlap the vertical transfer channel region of the first conductivity in the connection portion, a channel potential of the horizontal transfer channel region of the first conductivity positioned below the horizontal transfer electrodes is deeper than that of the vertical transfer channel region of the first conductivity positioned below the horizontal transfer electrodes. According to this preferable example, signal charges can be transferred from the vertical charge transferring portion to the horizontal charge transferring portion even more smoothly.

First Embodiment

Figures 2A, 2B:
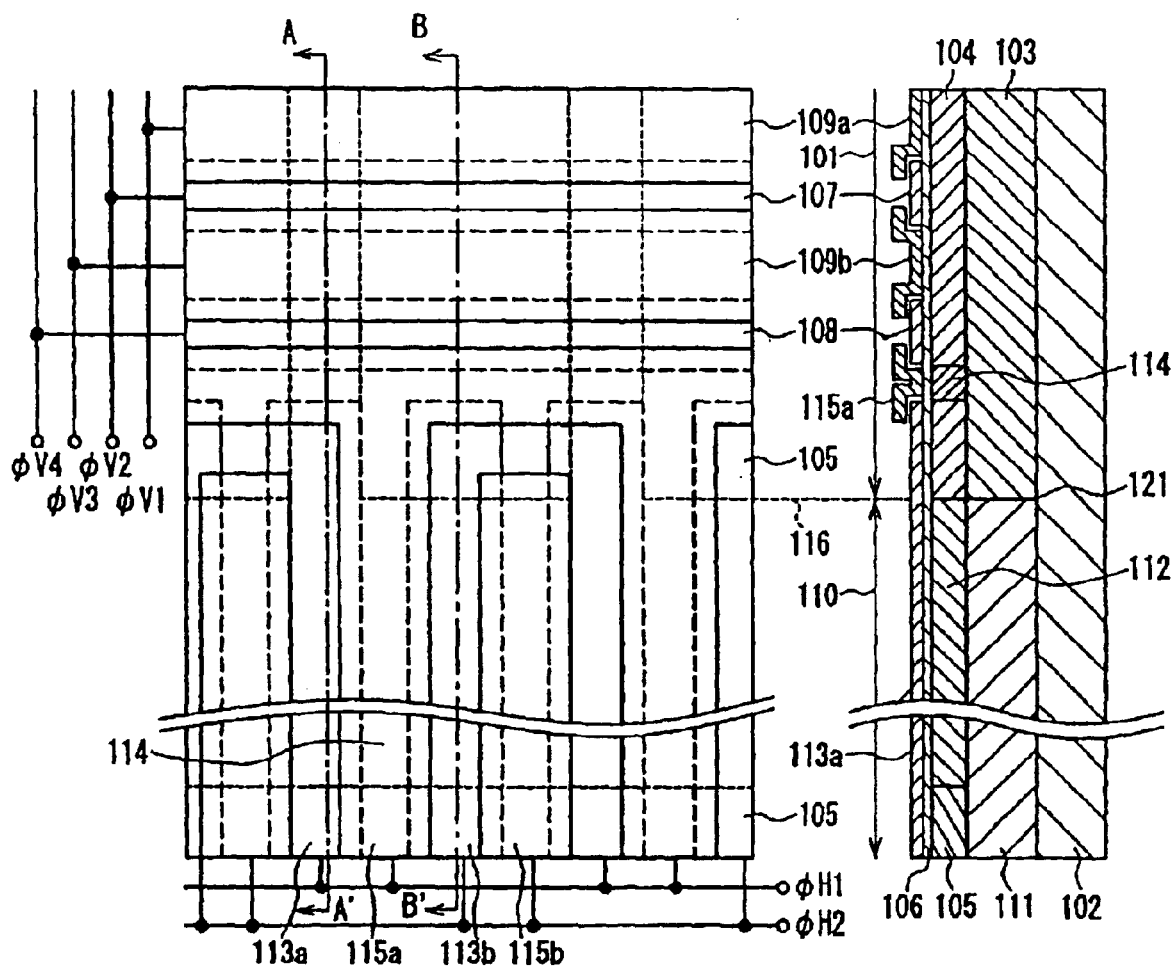
FIGS. 2A and 2B are schematic views showing an example of the structure in the vicinity of the connection portion between the vertical charge transferring portion and the horizontal charge transferring portion in the solid-state imaging device of the first embodiment.

An example of a solid-state imaging device of a first embodiment of the present invention will be described FIG. 1 is a schematic view showing an example of a solid-state imaging device of a first embodiment. FIGS. 2A and 2B are schematic views showing an example of the structure in the vicinity of the connection portion between the vertical charge transferring portion and the horizontal charge transferring portion in the solid-state imaging device of the first embodiment; and FIG. 2A is a plan view thereof and FIG. 2B is a cross-sectional view taken along line A–A' of FIG. 2A.

As shown in FIG. 1, this solid-state imaging device includes a plurality of photoelectric exchanging portions 130 arranged in a matrix, a plurality of arrays of vertical charge transferring portions 101 arranged corresponding to each array of the photoelectric exchanging portions 130, a horizontal charge transferring portion 110 electrically connected to one end of each vertical charge transferring portion 101, and an output circuit portion 131 connected to one end of the horizontal charge transferring portion 110.

As shown in FIGS. 2A and 2B, in the vertical charge transferring portion 101, a vertical p-type well 103 is formed in a surface layer portion of an $n^{--}$-type semiconductor substrate 102, and an n-type vertical transfer channel 104 is formed in the surface layer portion of the vertical p-type well 103. Furthermore, a $p^+$-type element isolating region 105 is formed between the vertical transfer channels 104. A plurality of vertical transfer electrodes 107, 109a and 109b and a final vertical transfer electrode 108 are formed on the vertical transfer channel 104 via a gate insulating film 106. The vertical transfer electrodes are wired such that a clock pulse $\phi V1$, $\phi V2$, $\phi V3$, or $\phi V4$ is applied to the vertical transfer electrodes.

In the horizontal charge transferring portion 110, a horizontal p-type well 111 is formed in a surface layer portion of the $n^{--}$-type semiconductor substrate 102, and an n-type horizontal transfer channel 112 is formed in the surface layer portion of the horizontal p-type well 111. A plurality of first horizontal transfer electrodes 113a and 113b are formed on the horizontal transfer channel 112 via the gate insulating film 106. Furthermore, an $n^-$-type potential barrier region 114 is formed in a gap between the first horizontal transfer electrodes, and second horizontal transfer electrodes 115a and 115b are formed on the potential barrier region 114 via the gate insulating film 106. The horizontal transfer electrodes are wired such that a clock pulse $\phi H1$ or $\phi H2$ is applied to the horizontal transfer electrodes.

The channel width of the vertical transfer channel 104 is narrower than that of the horizontal transfer channel 112, and therefore the n-type impurity concentration of the vertical transfer channel 104 is a higher than that of the horizontal transfer channel 112 in order to ensure the amount of transfer signals. Since the horizontal charge transferring portion 110 has a higher transfer frequency than that of the vertical charge transferring portion 10 1, the p-type impurity concentration of the horizontal p-type well 111 is lower than that of the vertical p-type well 103 so as to intensify the transfer electric field.

In the connection portion between each of the vertical charge transferring portions and the horizontal charge transferring portion, the vertical p-type well 103, the p+-type element isolating region 105 and the vertical transfer channel 104 extend from the vertical charge transferring portion side. In this connection portion, the p+-type element isolating region 105 is farmed so as to be overlapped on the end portion of the second horizontal transfer electrode 115b on the side of the vertical charge transferring portion. The vertical transfer channel 104 is formed so as to be overlapped on the end portions of the first horizontal transfer electrode 113a and the second horizontal transfer electrode 115a that receive the charges transferred from the vertical charge transferring portion 101 on the side of the vertical charge transferring portion. Furthermore, in this connection portion, the n-type potential barrier region 114 is formed in a gap between the final vertical transfer electrode 108 and the first horizontal transfer electrode 113a and the second horizontal transfer electrode 115a is overlapped on the potential barrier region 114 via the gate insulating film 106.

In this solid-state imaging device, the vertical p-type well 103, the vertical transfer channel 104 and the p+-type element isolating region 105 extend in the connection portion between vertical charge transferring portion 101 and the horizontal charge transferring portion 110, as described above, and the positions of the end portions 121 of the vertical p-type well 103 and the vertical transfer channel 104 are adjusted so as to substantially march the position of the end portion 116 off the p-type element isolating region 105 on the side of the horizontal charge transferring portion.

In other words, the vertical transfer channel 104 and the vertical p-type well 103 are formed both in a region below the final vertical transfer electrode 108 and a region below the first horizontal transfer electrode 113a and the second horizontal transfer electrode 115a in the connection portion. More specifically, the region below the final vertical transfer electrode 108 and the region below the first horizontal transfer electrode 113a in the connection portion have substantially the same impurity concentration.

Next, the charge transfer operation from the vertical charge transferring portion to the horizontal charge transferring portion of the solid-state imaging device will be described.

Figure 3:
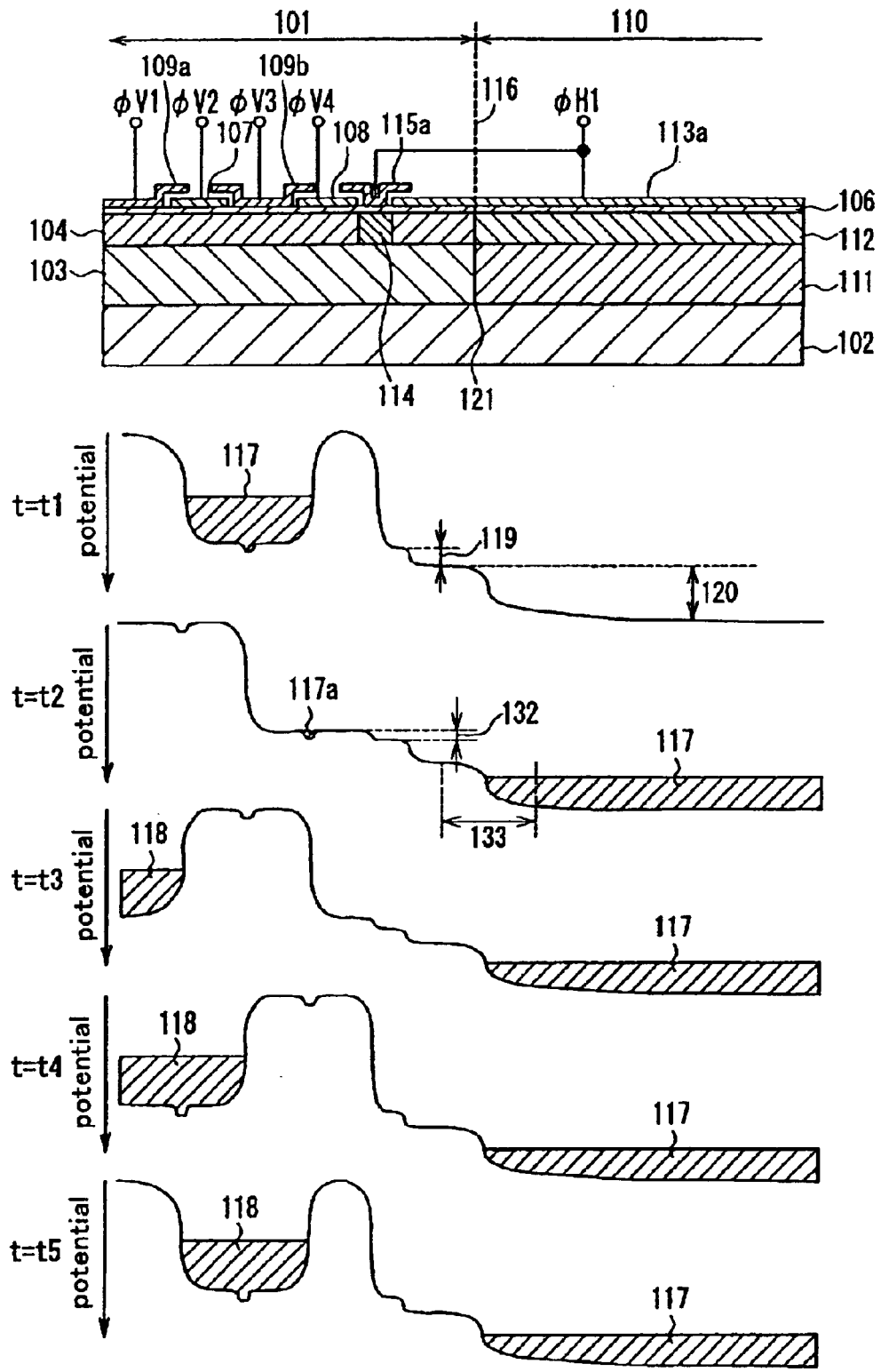
FIG. 3 is a schematic diagram showing the potential distribution during charge transfer from the vertical charge transferring portion to the horizontal charge transferring portion of the solid-state imaging device of the first embodiment.
Figure 21:
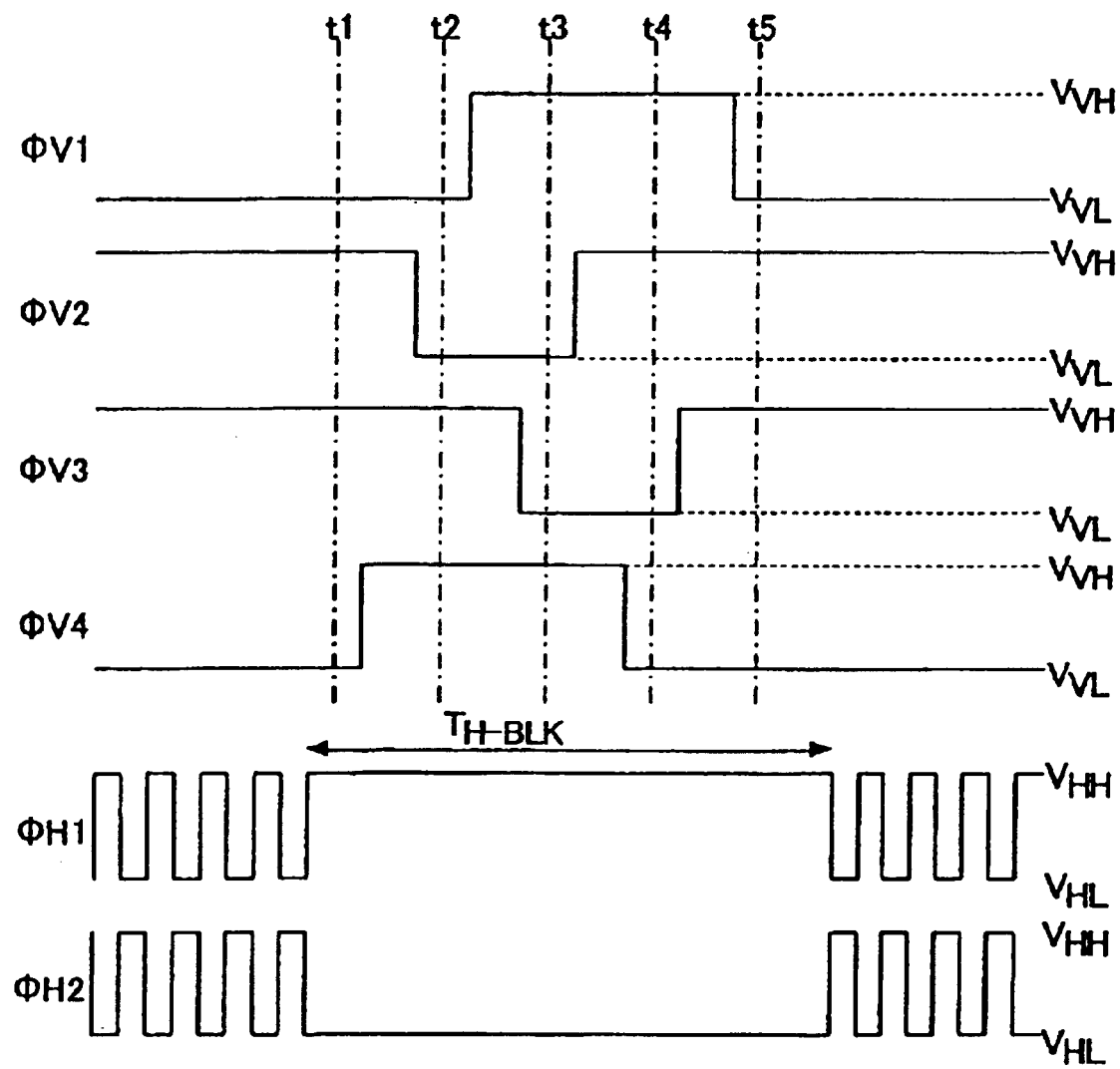
FIG. 21 is an example of clock pulses that are applied to the electrodes of the vertical charge transferring portion and the horizontal charge transferring portion.
Figure 22A:
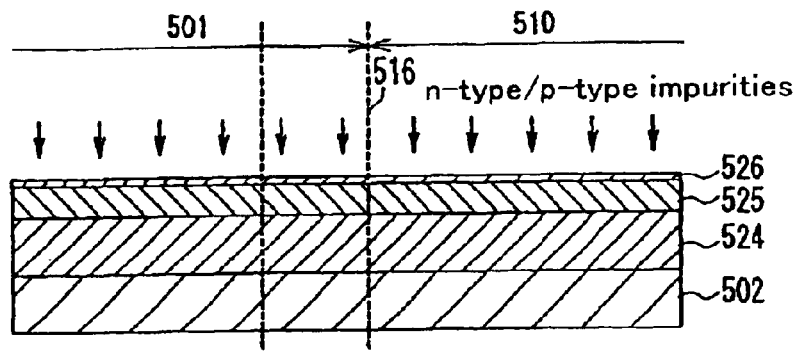
FIGS. 22A and 22B are schematic views illustrating a method for producing the conventional solid-state imaging device.
Figure 22B:
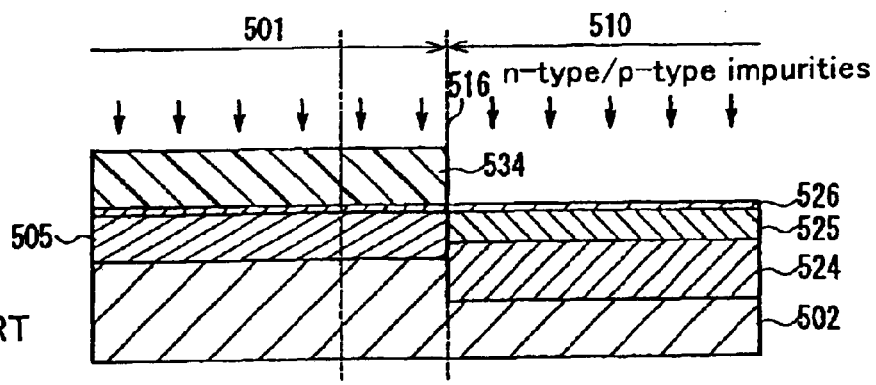
Figure 23A:
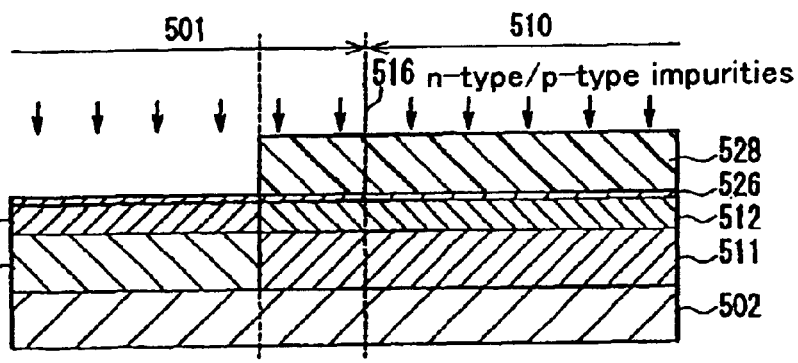
FIGS. 23A and 23B are schematic views illustrating the method for producing the conventional solid-state imaging device.
Figure 23B:
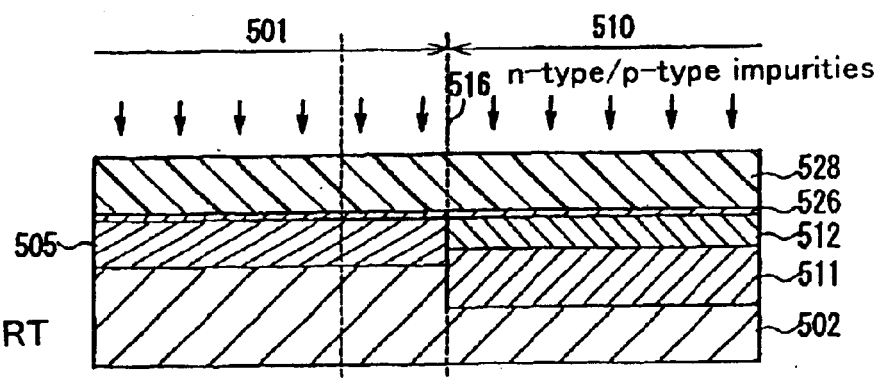
Figure 24A:
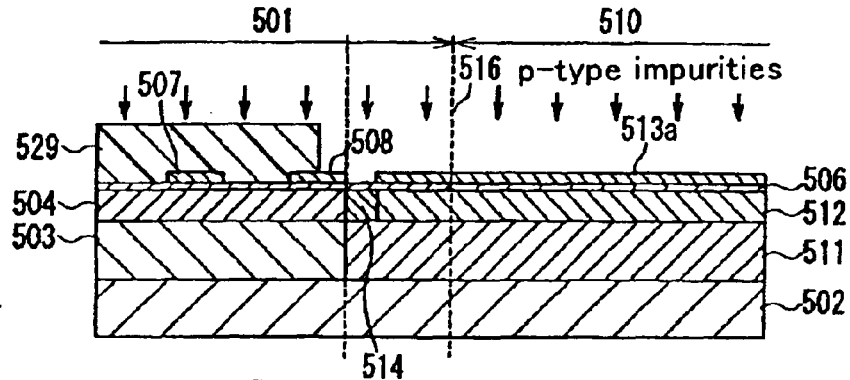
FIGS. 24A and 24B are schematic views illustrating the method for producing the conventional solid-state imaging device.
Figure 24B:
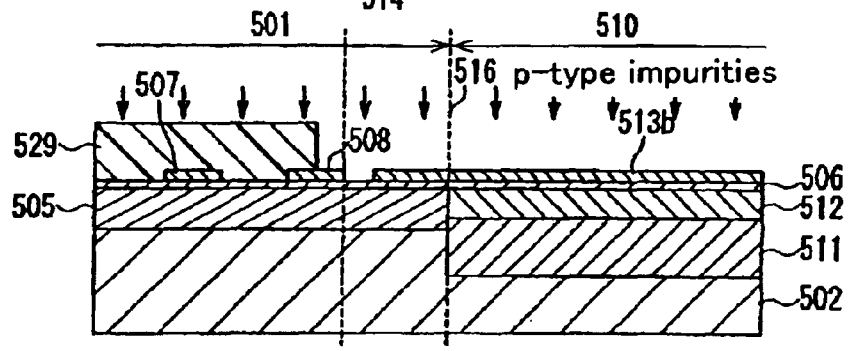
Figure 25A:
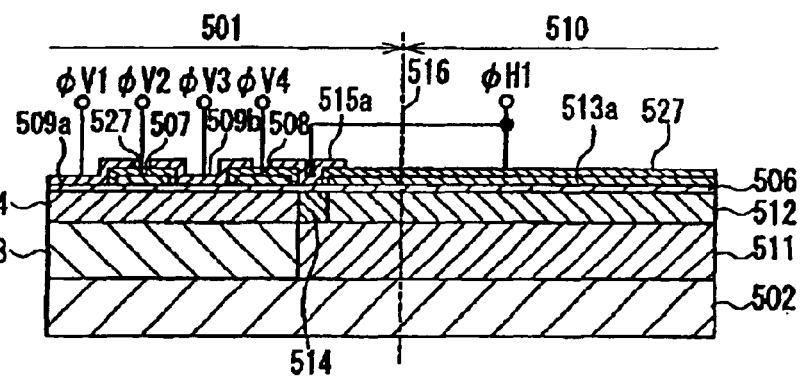
FIGS. 25A and 25B are schematic views illustrating the method for producing the conventional solid-state imaging device.
Figure 25B:
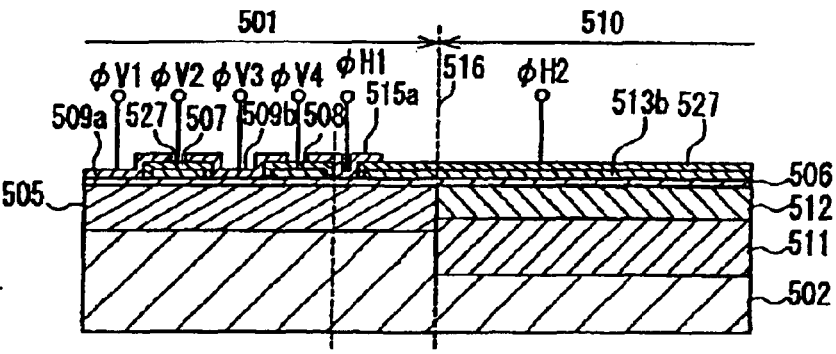

FIG. 21 shows an example of a clock pulse that is applied to each electrode of the vertical charge transferring portion and the horizontal charge transferring portion. In this FIG. 21, $\phi V1$ to $\phi V4$ are transfer pulses applied to the vertical transfer electrodes, and $\phi H1$ and $\phi H2$ are transfer pulses applied to the horizontal transfer electrodes. In each pulse, $V_{VH}$ and $V_{HH}$ indicate high level voltages, and $V_{VL}$ and $V_{HL}$ indicate low level voltages. FIG. 3 is a schematic diagram showing the potential distribution during charge transfer from the vertical charge transferring portion to the horizontal charge transferring portion when driven by the clock pulses shown in FIG. 21.

At a time t1, the signal charge 117 in the vertical charge transferring portion 101 is accumulated below the first vertical transfer electrode 107 and the second vertical transfer electrode 109b to which a high voltage $V_{VH}$ is applied. Next, at a time t2, the clock pulse $\phi V4$ changes from $V_{VL}$ to $V_{VH}$, and the clock pulse $\phi V2$ changes from $V_{VH}$ to $V_{VL}$, so that all the signal charge 117 except the signal charge 117a left in a gap between the final vertical transfer electrode 108 and the second vertical transfer electrode 109b are transferred from the vertical charge transferring portion 101 to the horizontal charge transferring portion 110. Then, at a time t3, the clock pulse $\phi V1$ changes from $V_{VL}$ to $V_{VH}$, and the clock pulse $\phi V3$ changes from $V_{VH}$ to $V_{VL}$, so that the left signal charge 117a also is transferred from the vertical charge transferring portion 101 to the horizontal charge transferring portion 110. Thus, all the signal charge 117 is accumulated in the first horizontal transfer electrode 113a to which $V_{HH}$ of the horizontal charge transferring portion 110 is applied. At a time t4, the clock pulse $\phi V2$ changes from $V_{VL}$ to $V_{VH}$, and the clock pulse $\phi V4$ changes from $V_{VH}$ to $V_{VL}$, and the next signal charge 118 has been transferred up to a portion below the first vertical transfer electrode 107 and the second vertical transfer electrode 109a to which a high voltage $V_{HH}$ is applied. At a time t5, the dock pulse $\phi V3$ changes from $V_{VL}$ to $V_{VH}$, and the clock pulse $\phi V1$ changes from $V_{VH}$ to $V_{VL}$, so that the next signal charge 118 is transferred up to a portion below the first vertical transfer electrode 107 and the second vertical transfer electrode 109b to which a high voltage $V_{VH}$ is applied. Thereafter, the horizontal charge transferring portion 110 is operated so that transfer pulses $\phi H1$ and $\phi H2$ that have opposite phases to each other are applied to the horizontal transfer electrodes, and the signal charge 117 is transferred in the horizontal charge transferring portion. Thereafter, by repeating this operation, the signal charge 117 is transferred in the vertical charge transferring portion 101 and the horizontal charge transferring portion 110.

As shown in FIG. 3, in the connection portion between each of the vertical charge transferring portions and the horizontal charge transferring portion, a potential barrier 119 is present because of the potential barrier region 114 formed below the second horizontal transfer electrode 115a, and further a potential battier 120 is present as a result of a narrow channel effect caused by the element isolating region 105 of the vertical charge transferring portion. Therefore, the reverse transfer of the signal charge from the horizontal charge transferring portion to the vertical charge transferring portion is prevented.

Next, the effect achieved by such a solid-state imaging device will be described with reference to FIGS. 2 and 3, as described above, this solid-state imaging device is formed such that the transfer channel 104 and the element isolating region 105 extend in the connected potion between the vertical charge transferring portion 101 and the horizontal charge transferring potion 110, and the position of the end portion 121 of the vertical transfer channel 104 substantially matches the position of the end portion of the element isolating region 105. In other words, the region below the final vertical transfer electrode 108 and the region below the first horizontal transfer electrode 113a in the connection portion have substantially the same impurity concentration.

Figure 20:
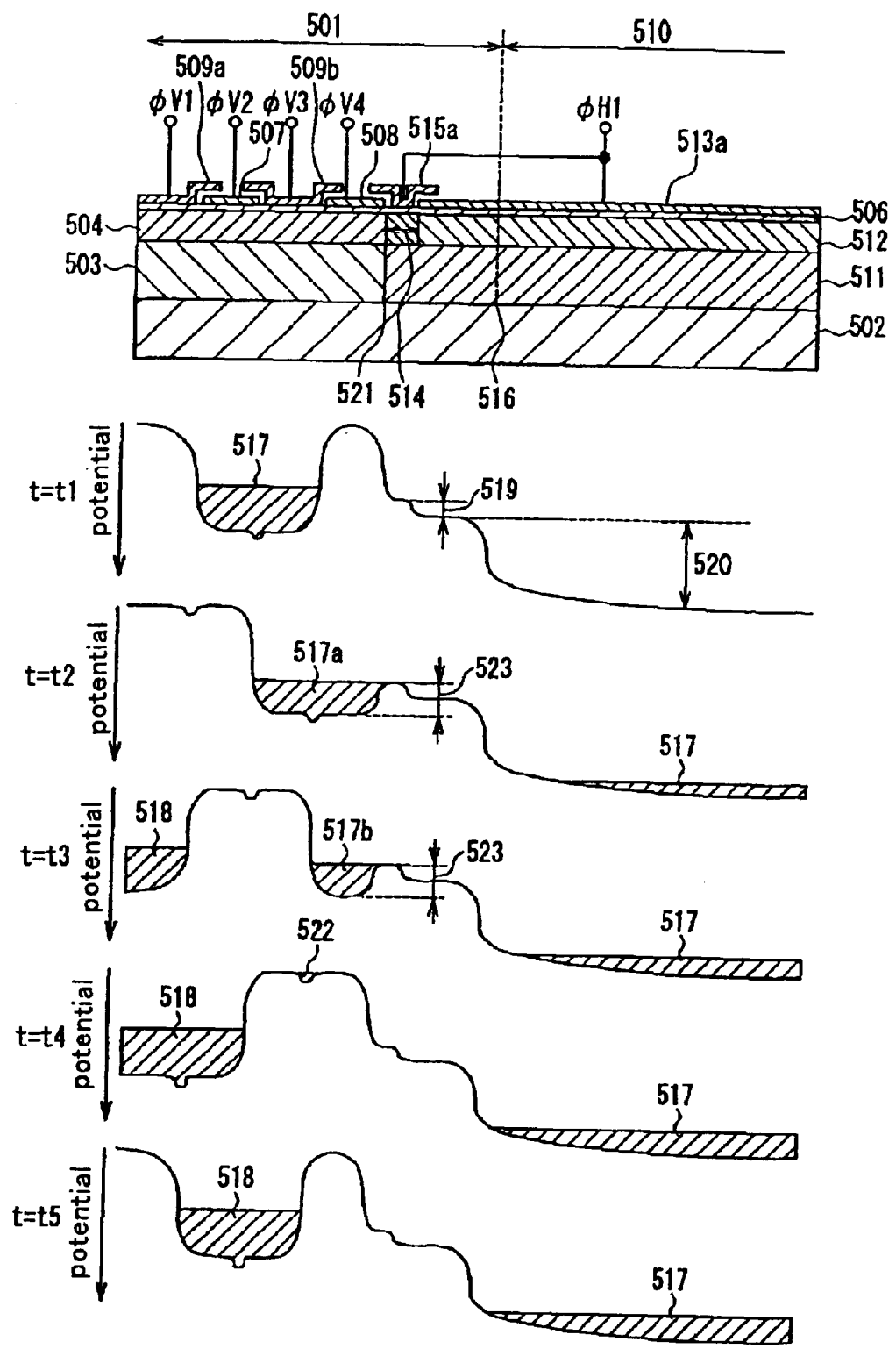
FIG. 20 is a schematic diagram showing the potential distribution during charge transfer from the vertical charge transferring portion to the horizontal charge transferring portion of the conventional solid-state imaging device.

Therefore, even if the difference in the n-type impurity concentration between the vertical transfer channel 104 and the horizontal transfer channel 112 is increased in order to increase the amount of transfer charge of the vertical charge transferring portion 101 or the low voltage driving of the horizontal charge transferring portion 110 is promoted, the channel potential below the second horizontal transfer electrode 115a and the first horizontal transfer electrode 113a (to which $V_{HH}$ is applied) in the connection portion is deeper than the channel potential below the final vertical transfer electrode 108 (to which $V_{VH}$ is applied) (see reference numeral 132 of FIG. 3). Therefore, a transfer barrier (reference numeral 523 of FIG. 20) does not occur as in the conventional solid-state imaging device, and during times t2 to t3, the signal charge 117 is transferred to the horizontal charge transferring portion 110 smoothly. Consequently, the occurrence of abnormal display such as appearance of vertical lines called black line defects can be suppressed. Therefore, the miniaturization of pixels, the high-speed driving of the vertical charge transferring portion and the low voltage driving of the horizontal charge transferring portion can be promoted while ensuring good display characteristics.

The more the n-type impurity concentration of the vertical transfer channel 104 is higher than that of horizontal transfer channel 112, the lower the potential barrier 120 generated by the narrow channel effect of the element isolating region 105 of the vertical charge transferring portion is. Therefore, it is preferable to set the n-type impurity concentration of the vertical transfer channel 104 to be higher than that of horizontal transfer channel 112 within the range in which the potential barrier 120 does not appear.

In the connection portion, it is preferable that the end portion 121 of the vertical transfer channel 104 and the cad portion 116 of the p+-type element isolating region 105 are formed such that the positions thereof substantially match each other. However, since the channel potential from the vertical charge transferring portion 101 to the horizontal charge transferring portion 110 changes so as to be gradually deeper because of the narrow channel effect, if the position of the end portion 121 of the vertical transfer channel 104 is within this range of the changing region 133 of this channel potential, the potential depression or the generation of a barrier can be suppressed sufficiently, and it is possible to achieve the above-described effect More specifically, the end portion 121 of the vertical transfer channel 104 can be positioned more on the side of the horizontal charge transferring portion than the end portion of the final vertical transfer electrode 108 on the side of the horizontal charge transferring portion and be positioned within 1.5 $\mu$m from the end portion 116 of the p+-type element isolating region 105.

Next, the above-described effect will be described more specifically, using an example of the forming conditions and the driving conditions of the solid-state imaging device.

The channel width of the vertical transfer channel 104 of the solid-state imaging device is, for example, 0.7 $\mu$m, so as to be adapted for miniaturization of pixels, one side of which is 3 $\mu$m or less. The channel width of the horizontal transfer channel 112 is irrelevant to the miniaturization of pixels and can be, for example, 30 $\mu$m. Thus, the channel width of the vertical transfer channel 104 is smaller than that of the horizontal transfer channel 112, so that the n-type impurity concentration of the vertical transfer channel 104 is higher than that of the horizontal transfer channel 112 in order to ensure the amount of transfer signals. For example, the n-type impurity concentration of the vertical transfer channel 104 can be $2 \times 10^{17}$ cm$^{-3}$, and the n-type impurity concentration of the horizontal transfer channel 112 can be $1.5 \times 10^{17}$ cm$^{-3}$. Furthermore, the horizontal charge transferring portion 110 has a higher transfer frequency than that of the vertical charge transferring portion 101, so that the p-type impurity concentration of the horizontal p-type well 111 is lower than that of the vertical p-type well 103 in order to intensity the transfer electric field. For example, the p-type impurity concentration of the vertical p-type well 103 can be $2 \times 10^{16}$ cm$^{-3}$, and the p-type impurity concentration of the horizontal p-type well 111 can be $1.5 \times 10^{16}$ cm$^{-3}$. The n$^-$-type potential barrier region 114 formed in a gap between the first horizontal transfer electrodes, and a gap between the final vertical transfer electrode 108 and the first horizontal transfer electrode 113a can be formed by implanting ions of p-type impurities such as boron in a dose amount of $5.0 \times 10^{11}$ cm$^{-2}$ onto the vertical transfer channel having the aforementioned impurity concentration.

In each pulse shown in FIG. 21, for the voltages $\phi$V1 to $\phi$V4 and $\phi$H1 and $\phi$H2, for example, $V_{VH}$=0V, $V_{HH}$=3V, $V_{VL}$=−8V, and $V_{HL}$=0V.

Figure 4:
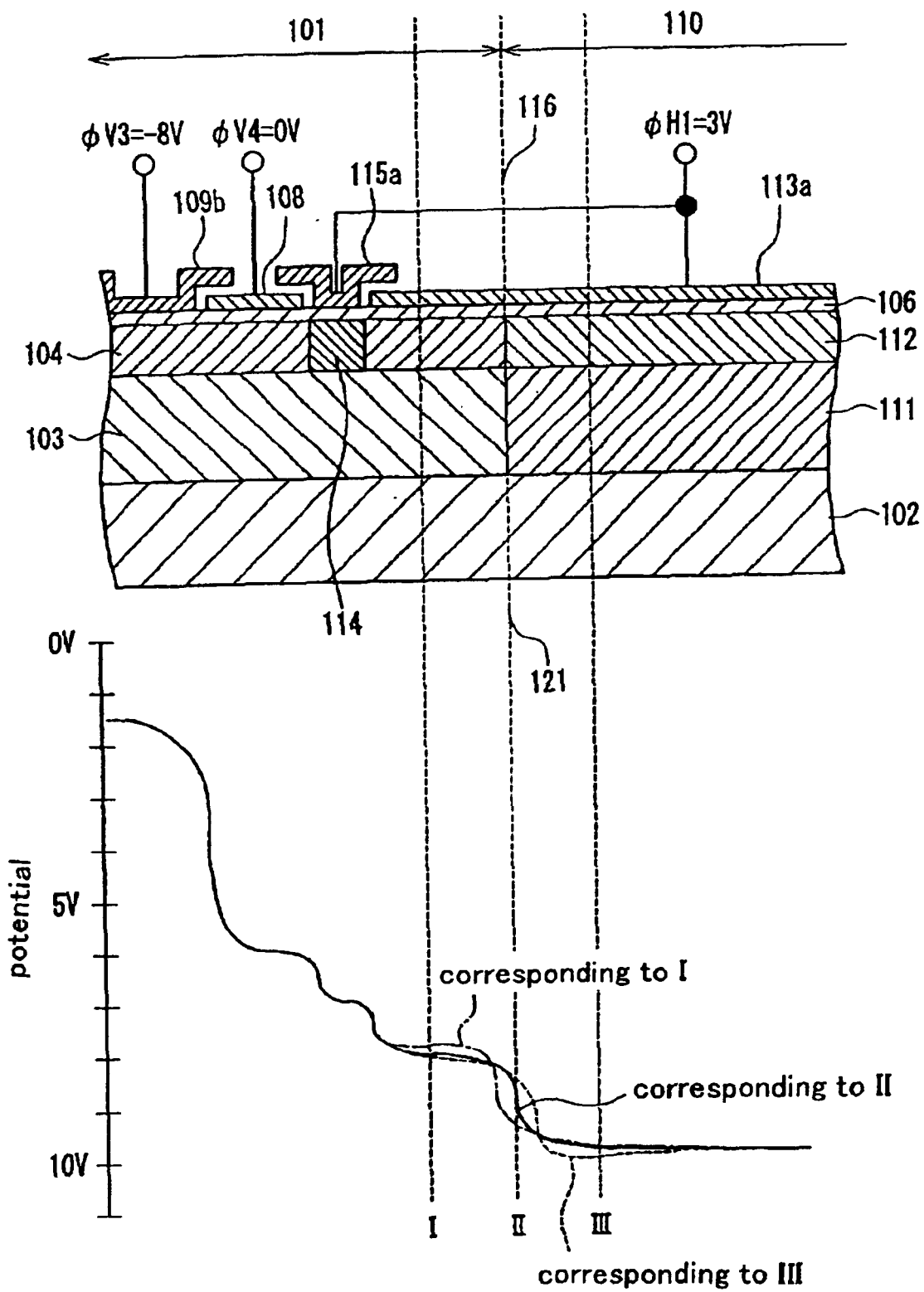
FIG. 4 is a schematic diagram showing the channel potential distribution from the vertical charge transferring portion to the horizontal charge transferring portion when the solid-state imaging device of the first embodiment of the present invention is driven.

FIG. 4 shows the channel potential distribution from each of the vertical charge transferring portions to the horizontal charge transferring portion of the solid-state imaging device that is formed under these conditions and driven. FIG. 4 shows the channel potential distributions in the following cases: the position of the end portion 121 of the vertical transfer channel is shifted by 2 $\mu$m to the side of the vertical charge transferring portion with respect to the position of the end portion 116 of the element isolating region (1), the positions are matched (II), and the position of the end portion 121 of the vertical transfer channel is shifted by 2 $\mu$m to the side of the horizontal charge transferring portion.

When the position of the end portion 121 of the vertical transfer channel is matched to the position of the end portion 116 of the element isolating region (II), the channel potential below the final vertical transfer electrode 108 (to which $V_{VH}$=0V is applied) is about 6V because of the narrow channel effect, the channel potential of a region (potential barrier region 114) positioned below the second horizontal transfer electrode 115a (to which $V_{HH}$=3V is applied) in the connection portion is about 7V because of the narrow channel effect, and the channel potential of a region (vertical transfer channel 104) positioned below the first horizontal transfer electrode 113a (to which $V_{HH}$=3V is applied) in the connection portion is about 8V because of the narrow channel effect. On the other hand, the channel potential of a region (horizontal transfer channel 112) positioned below the first horizontal transfer electrode 113a (to which $V_{HH}$=3V is applied) in the horizontal charge transferring portion is about 10V because there is almost no narrow channel effect. Thus, the channel potential is farmed so as to become gradually deeper front the final vertical transfer electrode 108 to the horizontal transfer channel 112, so that the signal charge can be transferred from the vertical charge transferring portion 101 to the horizontal charge transferring portion 110 smoothly in a short time.

Furthermore, when the position of the end portion 121 of the vertical transfer channel is shifted to the side of the vertical charge transferring portion with respect to the end portion 116 of the element isolating region, a potential barrier tends to occur, and when it is shifted to the side of the horizontal charge transferring portion, a potential depression tends to occur (I and III).

Figure 5:
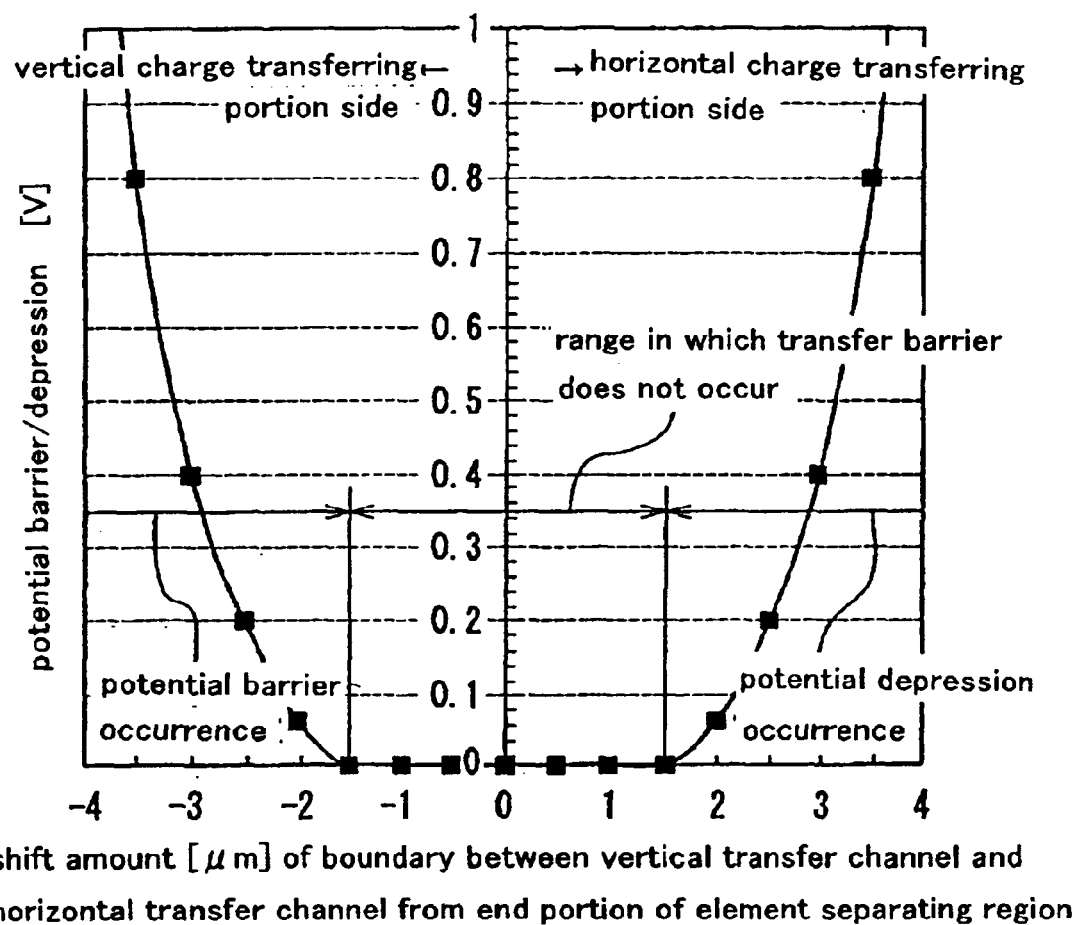
FIG. 5 is a graph showing the results of analyzing the potential barrier and the potential depression occurring between the vertical charge transferring portion and the horizontal charge transferring portion when the position of the end portion of the vertical transfer channel is shifted with respect to the end portion of the element separating region.

FIG. 5 is a graph showing the results of analyzing the magnitude of the potential barrier and the potential depression occurring between the vertical charge transferring portion and the horizontal charge transferring portion by simulation when the position of the end portion 121 of the vertical transfer channel is shifted to the side of the vertical charge transferring portion and the side of the horizontal charge transferring portion with respect to the end portion 116 of the element isolating region 105. As shown in these results, when the shift between the position of the end portion 121 of the vertical transfer channel and the end portion 116 of the element isolating region is within 1.5 $\mu$m or less, substantially no potential barrier or potential depression occur, and the occurrence of abnormal display such as appearance of vertical lines called black line defects can be suppressed.

Second Embodiment

Next, a first example of a method for producing the solid-state imaging device will be described. FIGS. 6A, 6B, 7A, 7B, 8A, 8B, 9A and 9B are views illustrating a method for producing the solid-state imaging device. FIGS. 6A, 7A, 8A, and 9A show a portion corresponding to the cross section taken along line A–A' of FIG. 2A, and FIGS. 6B, 7B, 8B, and 9B show a portion corresponding to the cross section taken along line B–B' of FIG. 2A.

As shown in FIGS. 6A and 6B, a protective film 126 such as an oxide film is formed on the surface of the n$^{--}$-type semiconductor substrate 102. An ion implantation blocking film 135 such as a nitride film is formed on the protective film 126, and a first photoresist film 134 is formed on the surface of the ion implantation blocking film 135. Then, the first photoresist film 134 and the ion implantation blocking film 135 are patterned and removed such that the first photoresist film 134 and the ion implantation blocking film 135 are removed from the region where a vertical transfer channel and a horizontal transfer channel are to be formed, and are left on the portion to be formed into the element isolating region. Thereafter, a p-type region 124 is formed by implanting ions of p-type impurities such as boron into the surface layer portion of the n$^{--}$-type semiconductor substrate 102, and an n-type region 125 is formed by implanting ions of n-type impurities such as phosphorus or arsenic into the surface layer portion of the p-type region 124.

Figure 7A:
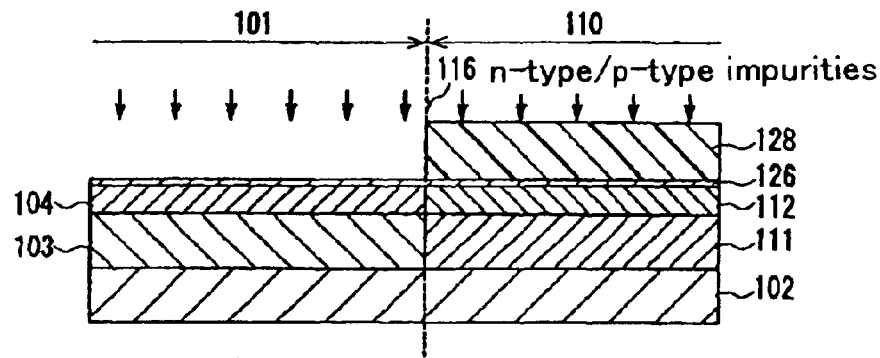
FIGS. 7A and 7B are schematic views illustrating the first example of the method for producing the solid-state imaging device of the first embodiment.
Figure 7B:
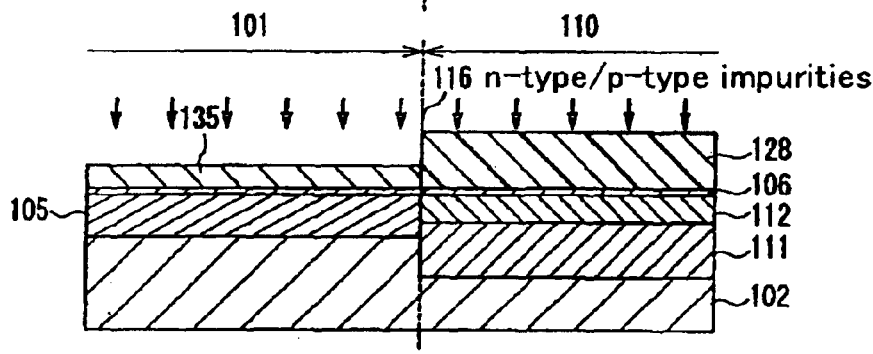

Then, the first photoresist film 134 is removed entirely. In this case, the ion implantation blocking film 135 is left as it is on the substrate. Then, a second photoresist film 128 is formed on the surface of the protective film 126 and the ion implantation blocking film 135. Thereafter, as shown in FIGS. 7A and 7B, the second photoresist film 128 is patterned and removed such that the second photoresist film 128 is removed from at least on the region where a vertical transfer channel is to be formed and is left on the region where a horizontal transfer channel is to be formed. Using as a mask the second photoresist film 128 and the ion implantation blocking film 135 that are left, a vertical p-type well 103 is formed by implanting ions of p-type impurities such as boron in substantially the same depth as the p-type region 124, and a vertical transfer channel 104 is formed by implanting ions of n-type impurities such as phosphorus or arsenic in substantially the same depth as the n-type region 125. The portions of the p-type region 124 and the n-type region 125 in which the vertical p-type well 103 and the vertical transfer channel 104 are not formed serve as a horizontal p-type well 111 and a horizontal transfer channel 112, respectively.

At this point, the shift between the positions of the boundary between the vertical transfer channel and the horizontal transfer channel (the end portion 121 of the vertical transfer channel on the side of the horizontal charge transferring portion) and the boundary between the vertical p-type well and the horizontal p-type well (the end portion 137 of the vertical p-type well on the side of the horizontal charge transferring portion), and the position of the end portion of the region to be formed into the element isolating region 105 on the side of the horizontal charge transferring portion (corresponding to reference numeral 116 of FIG. 7B) is adjusted so as to be within 1.5 μm.

Figure 8A:
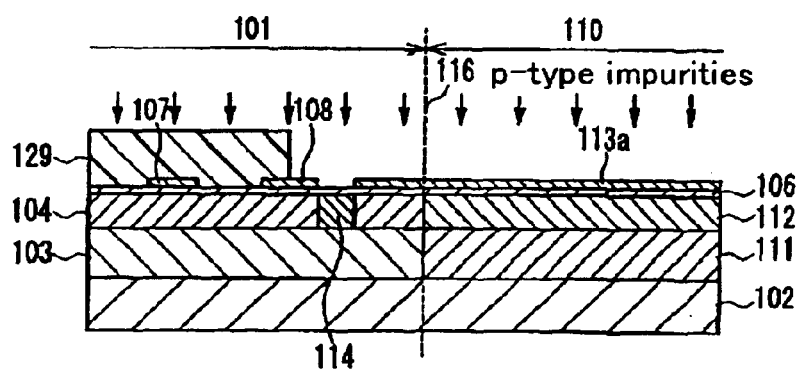
FIGS. 8A and 8B are schematic views illustrating the first example of the method for producing the solid-state imaging device of the first embodiment.
Figure 8B:
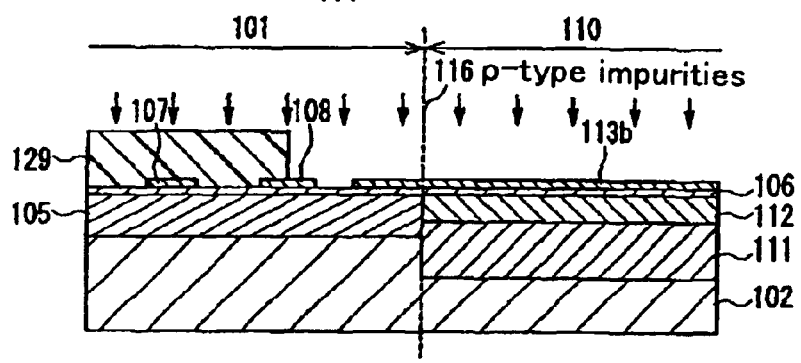

Then, after the second photoresist film 128 and the ion implantation blocking film 135 are removed entirely, as shown in FIGS. 8A and 8B, the element isolating region 105 is formed by implanting ions of p-type impurities such as boron into the region other than the vertical transfer channel and the horizontal transfer channel of the surface layer portion of the n$^{--}$-type semiconductor substrate 102. After the protective film 126 is removed entirely, a gate insulating film 106 is formed on the surface, and transfer electrodes 107, 108. 113a, and 113b of the first layer are formed on the gate insulating film 106. Furthermore, a third photoresist film 129 is formed on the surface and then removed from the region on the side of the horizontal transfer channel so as to have the end portion on the final vertical transfer electrode 108. Thereafter, an n$^{-}$-type potential barrier region 114 is formed by implanting ions of p-type impurities such as boron.

Figure 9A:
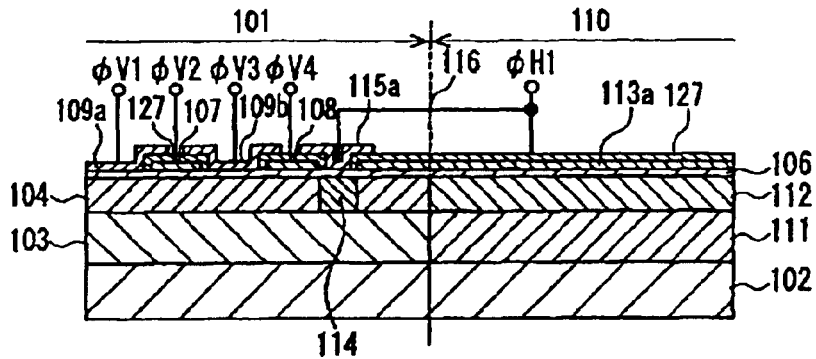
FIGS. 9A and 9B are schematic views illustrating the first example of the method for producing the solid-state imaging device of the first embodiment.
Figure 9B:
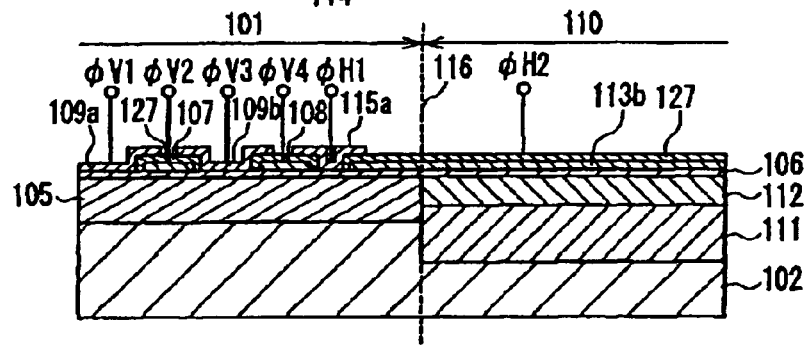

Then, after the third photoresist film 129 is removed entirely, as shown in FIGS. 9A and 9B, an interlayer insulating film 127 is formed around the transfer electrodes 107, 108, 113a, and 113b of the first layer, and transfer electrodes 109a, 109b, 115a, and 115b of the second layer are formed. Wiring is performed with metal films such as aluminum or tungsten such that the clock pulses φV1, φV2, φV3, and φV4 are applied to the vertical transfer electrodes 109a, 107, 109b, and 108, respectively, and the clock pulses φH1 and φH2 are applied to a pair of horizontal transfer electrodes 113a and 115a and a pair of horizontal transfer electrodes 113b and 115b, respectively. Thus, the solid-state imaging device of the first embodiment is produced.

Next, the effects achieved by this method for producing a solid-state imaging device will be described with reference to FIGS. 6A, 6B, 7A and 7B. In this production method, the vertical transfer channel 104 and the vertical p-type well 103 are formed in the following manner as described above: The first photoresist film 134 and the ion implantation blocking film 135 are patterned and removed, and then ions of n-type impurities and p-type impurities are implanted [FIGS. 6A and 6B]. Then, after the second photoresist film 128 is formed, the second photoresist film 128 is removed from at least the region where a vertical transfer channel is to be formed, and then ions of p-type impurities and n-type impurities are implanted, using as a mask the second photoresist film 128 and the ion implantation blocking film 135 that are patterned and left [FIGS. 7A and 7B]. Thus, the vertical transfer channel 104 and the vertical p-type well 103 in the method for producing the solid-state imaging device of the second embodiment are formed by two operations of n-type impurity and p-type impurity ion implantation, respectively, in the same manner as in the conventional production method. However, in this case, ions are implanted using as a mask the ion implantation blocking film 135 that has been patterned and removed in one photoresist process, and therefore a positional shift in the horizontal direction or a width spread of the implanted region between the first and the second ion implantation does not occur, which stabilizes the widths of the vertical transfer channel 104 and the vertical p-type well 103 to be formed. As a result, even if the miniaturization of pixels is promoted, a variation in the amount of transfer charges in the vertical charge transferring portion and poor transfer of signal charges from the vertical charge transferring portion to the horizontal charge transferring portion can be suppressed.

Third Embodiment

Next, a second example of the method for producing the solid-state imaging device of the first embodiment will be described. FIGS. 10A, 10B, 11A, 11B, 12A, 12B, 13A, 13B and 14A and 14B are views illustrating a method for producing the solid-state imaging device. FIGS. 10A, 11A, 12A, 13A, and 14A show a portion corresponding to the cross section taken along line A–A' of FIG. 2A, and FIGS. 10B, 11B, 12B, 13B, and 14B show a portion corresponding to the cross section taken along line B–B' of FIG. 2A.

Figure 10A:
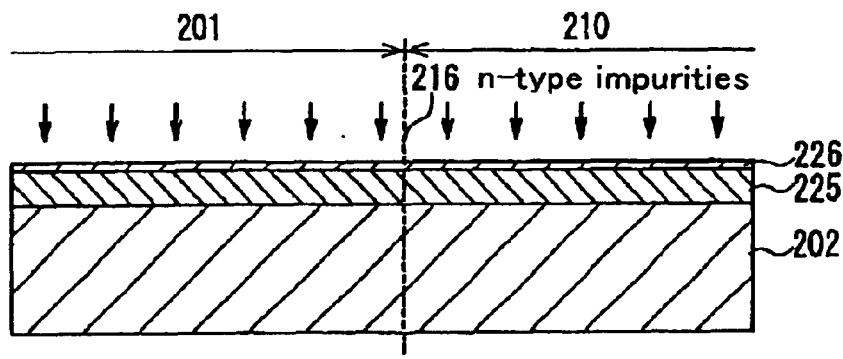
FIGS. 10A and 10B are schematic views illustrating a second example of the method for producing the solid-state imaging device of the first embodiment.
Figure 10B:
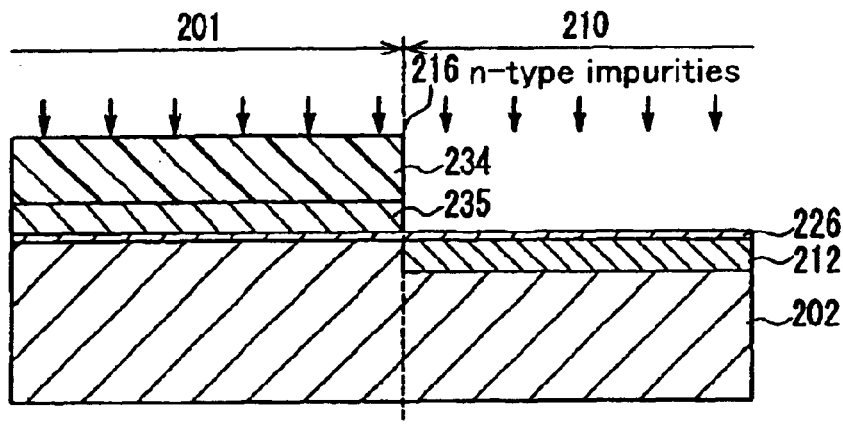

First, as shown in FIGS. 10A and 10B, a protective film 226 such as an oxide film is formed on the surface of the n$^{--}$-type semiconductor substrate 202. An ion implantation blocking film 235 such as a nitride film is formed on the protective film 226, and a first photoresist film 234 is formed on the surface of the ion implantation blocking film 235. Then, the first photoresist film 234 and the ion implantation blocking film 235 are patterned and removed such that the first photoresist film 234 and the ion implantation blocking film 235 are removed from the region where a vertical transfer channel and a horizontal transfer channel are to be formed, and are left on the portion to be formed into the element isolating region. Thereafter, an n-type region 225 is formed by implanting ions of n-type impurities such as phosphorus or arsenic into the surface layer portion of the n$^{--}$-type semiconductor substrate 202.

Figure 11A:
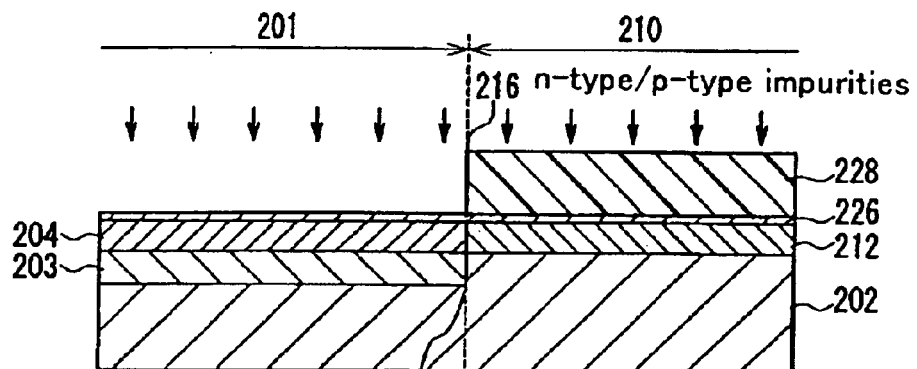
FIGS. 11A and 11B are schematic views illustrating the second example of the method for producing the solid-state imaging device of the first embodiment.
Figure 11B:
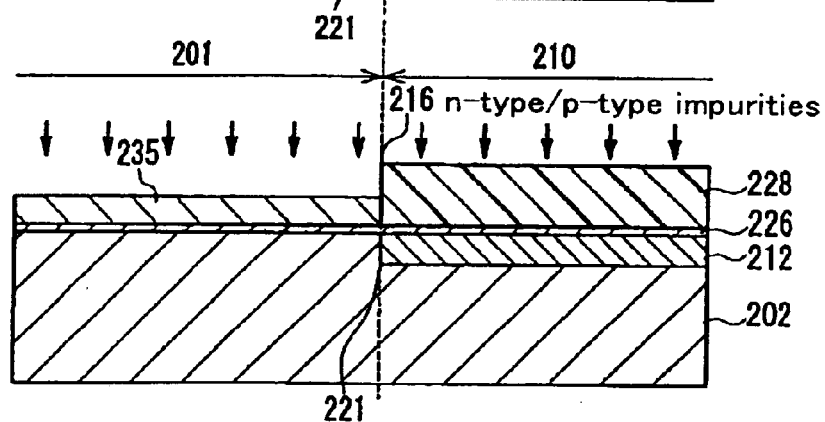

Then, the first photoresist film 234 is removed entirely. In this case, the ion implantation blocking film 235 is left as it is on the substrate. Then, a second photoresist film 228 is formed on the surface of the protective film 226 and the ion implantation blocking film 235. Thereafter, as shown in FIGS. 11A and 11B, the second photoresist film 228 is patterned and removed such that the second photoresist film 228 is removed from at least on the region where a vertical transfer channel is to be formed and is left on the region where a horizontal transfer channel is to be formed. Using as a mask the second photoresist film 228 and the ion implantation blocking film 235 that are left, a vertical p-type well 203 is formed by implanting ions of p-type impurities such as boron below the n-type region 225, and a vertical transfer channel 204 is formed by implanting ions of n-type impurities such as phosphorus or arsenic in substantially the same depth as the n-type region 225. The portion of the n-type region 225 in which the vertical transfer channel 204 is not formed serves as a horizontal transfer channel 212.

At this point, the shift between the position of the boundary between the vertical transfer channel and the horizontal transfer channel (the end portion 221 of the vertical transfer channel on the side of the horizontal charge transferring portion) and the position of the end portion of the region to be formed into the p$^+$-type element isolating region 205 on the side of the horizontal charge transferring portion (corresponding to reference numeral 216 of FIG. 11B) is adjusted so as to be within 1.5 $\mu$m.

Figure 12A:
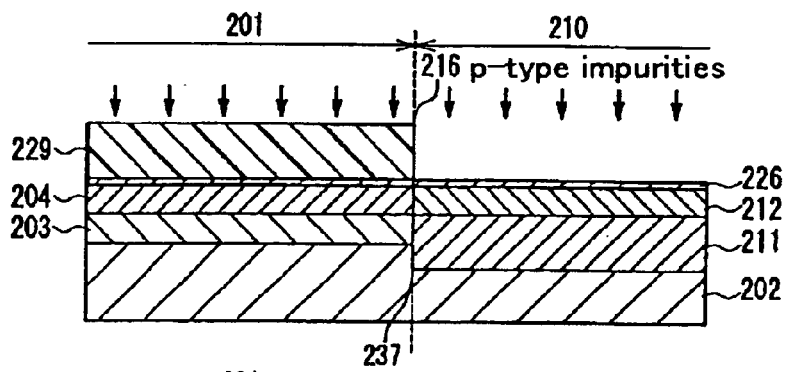
FIGS. 12A and 12B are schematic views illustrating the second example of the method for producing the solid-state imaging device of the first embodiment.
Figure 12B:
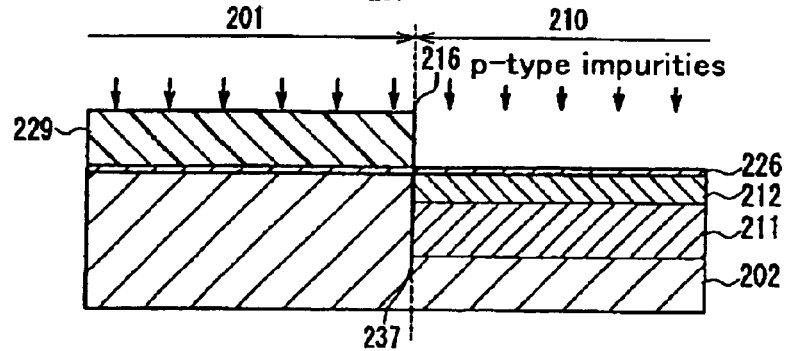
Figure 13A:
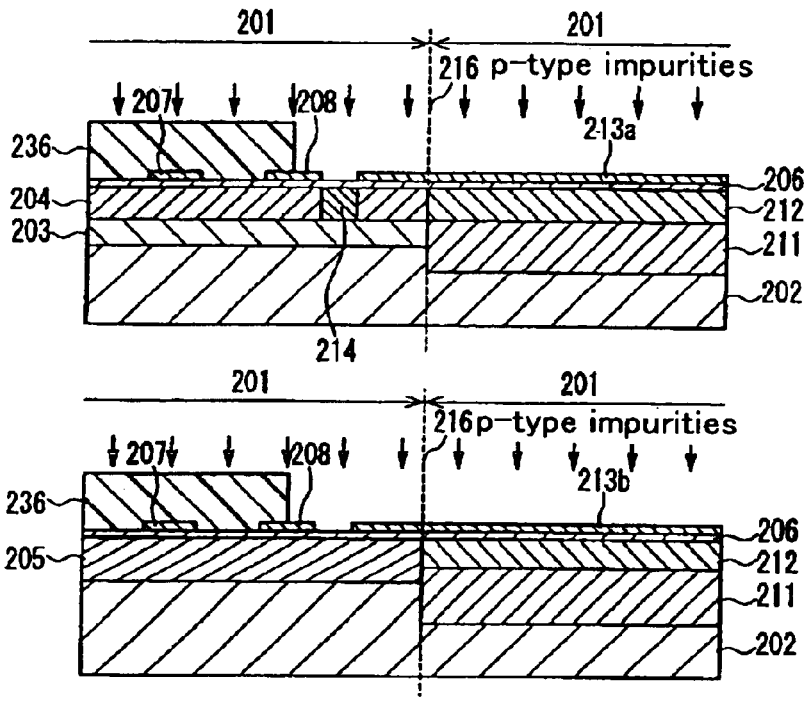
FIGS. 13A and 13B are schematic views illustrating the second example of the method for producing the solid-state imaging device of the first embodiment.
Figure 13B:
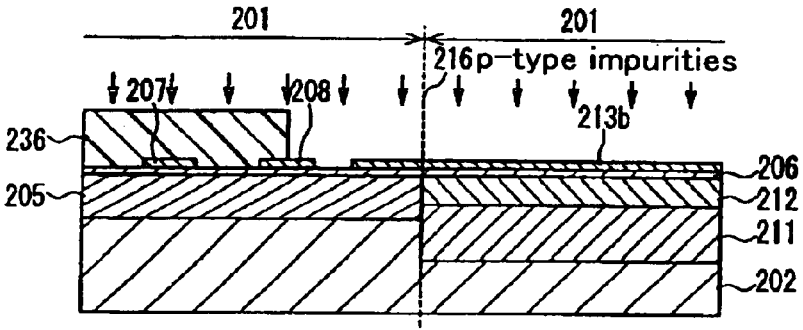

Then, after the second photoresist film 228 and the ion implantation blocking film 235 are removed entirely, a third photoresist film 229 is formed on the surface of the protective film 226. Thereafter, as shown in FIGS. 12A and 12B, the third photoresist film 229 is patterned and removed such that the third photoresist film 229 is left at least on the vertical transfer channel and removed from on the horizontal transfer channel. A horizontal p-type well 211 is formed by implanting ions of p-type impurities such as boron below the horizontal transfer channel 212, using as a mask the third photoresist film 229 that is left.

At this point, the shift between the position of the boundary between the vertical p-type well and the horizontal p-type well (the end portion 237 of the vertical p-type well on the side of the horizontal charge transferring portion) and the position of the end portion of the region to be formed into the p$^+$-type element isolating region 205 on the side of the horizontal charge transferring portion (corresponding to reference numeral 216 of FIG. 13B) is adjusted so as to be within 1.5 $\mu$m.

Then, after the third photoresist film 229 is removed entirely, as shown in FIGS. 1 3A and 133, the element isolating region 205 is formed by implanting ions of p-type impurities such as boron onto the region other than the vertical transfer channel and the horizontal transfer channel of the surface layer portion of the n$^{--}$-type semiconductor substrate 202. After the protective film 226 is removed entirely, a gate insulating film 206 is formed on the surface, and transfer electrodes 207,208, 213a, and 213b of the first layer are formed on the gate insulating film 206, Furthermore, a fourth photoresist film 236 is formed on the surface and then removed the region on the side of the horizontal transfer channel so as to have the end portion o final vertical transfer electrode 208. Thereafter, an n$^-$-type potential barrier region 214 is formed by implanting ions of p-type impurities such as boron.

Figure 14A:
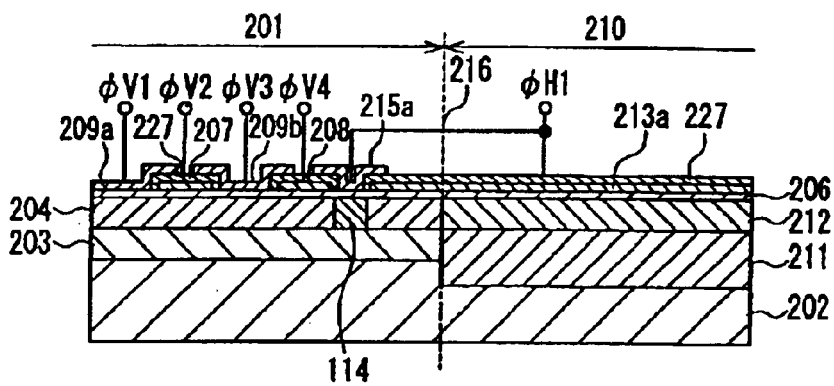
FIGS. 14A and 14B are schematic views illustrating the second example of the method for producing the solid-state imaging device of the first embodiment.
Figure 14B:
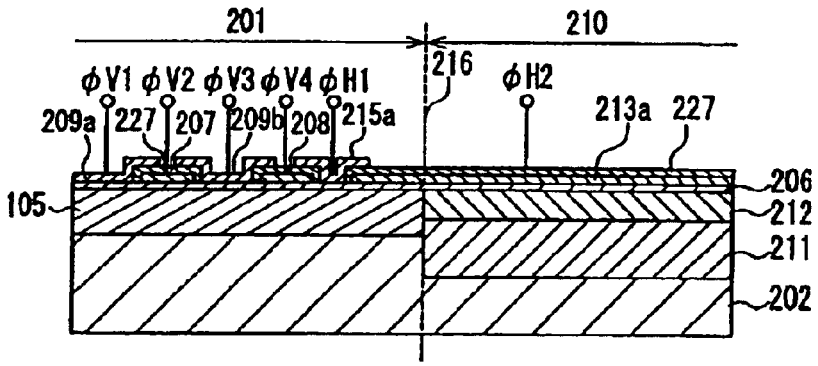

Then, after the fourth photoresist film 236 is removed entirely, as shown in FIGS. 14A and 14B, an interlayer insulating film 227 is formed around the transfer electrodes 207, 208, 213a, and 213b of the first layer, and transfer electrodes 209a, 209b, 215a, and 215b of the second layer are formed. Wiring is performed with metal films such as aluminum or tungsten such that the clock pulses $\phi$V1, $\phi$V2, $\phi$V3, and $\phi$V4 are applied to the vertical transfer electrodes 209a, 207, 209b, and 208, respectively, and the clock pulses $\phi$H1 and $\phi$H2 are applied to a pair of horizontal transfer electrodes 213a and 215a and a pair of horizontal transfer electrodes 213b and 215b, respectively. Thus, the solid-state imaging device of the first embodiment is produced.

Next, the effects achieved by this method for producing a solid-state imaging device will be described with reference to FIGS. 10A, 10B, 11A, 11B, 12A and 12B. In this production method as well as the production method of the second embodiment, the vertical transfer channel 204 is formed by two operations of ion implantation using as a mask the ion implantation blocking film 235 that has been patterned and removed in one photoresist process, and therefore a positional shift in the horizontal direction or a width spread of the implanted region between the first and the second n-type impurity ion implantation does not occur, which stabilizes the width of the vertical transfer channel 204 to be formed (FIGS. 10A, 10B, 11A and 11B). As a result, even if the miniaturization of pixels is promoted, a variation in the amount of transfer charges in the vertical charge transferring portion and poor transfer of signal charges from the vertical charge transferring portion to the horizontal charge transferring portion can be suppressed.

Furthermore, in the method for producing the solid-state imaging device of the third embodiment, the vertical p-type well 203 and the horizontal p-type well 211 are formed by the photoresist process and the ion implantation process that are independent from each other, and therefore each p-type well can be designed optimally (FIGS. 11A, 11B, 12A and 12B). For example, the vertical p-type well 203 having a high concentration can be formed in a shallow region of the n$^{--}$-type semiconductor substrate 202, and the horizontal p-type well 211 having a low concentration can be formed in a deep region of the n$^{--}$-type semiconductor substrate 202. Thus, an increase of the amount of signal charges and a reduction of smear in the vertical charge transferring portion 201 can be achieved together with the improvement of the charge transfer efficiency in the horizontal charge transferring portion 210.

Fourth Embodiment

Next, a third example of the method for producing the solid-state imaging device of the first embodiment will be described. FIGS. 15A, 15B, 16A, 16B, 17A, 17B, 18A and 18B are views illustrating a method for producing the solid-state imaging device. FIGS. 15A, 16A, 17A, and 18A show a portion corresponding to the cross section taken along line A–A' of FIG. 2A, and FIGS. 15B, 16B, 17B, and 18B show a portion corresponding to the cross section taken along line B–B' of FIG. 2A.

Figure 15A:
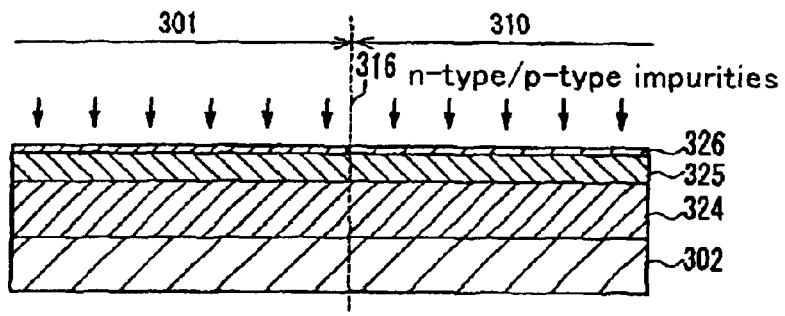
FIGS. 15A and 15B are schematic views illustrating a third example of the method for producing the solid-state imaging device of the first embodiment.
Figure 15B:
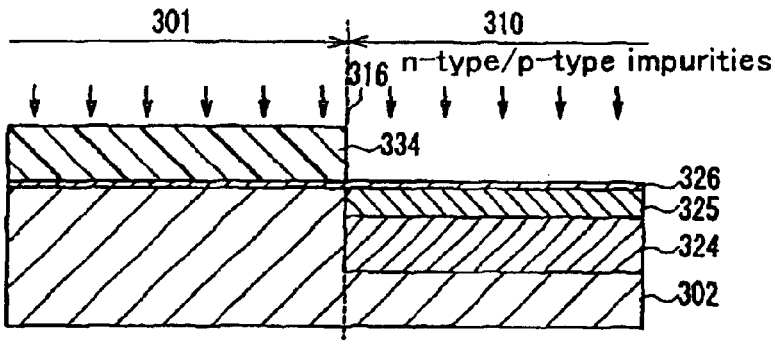

As shown in FIGS. 15A and 15B, a protective film 326 such as an oxide film is formed on the surface of the n$^{--}$-type semiconductor substrate 302. A first photoresist film 334 is formed on the surface of the protective film 326. Then, the first photoresist film 334 is patterned and removed such that the first photoresist film 334 is left on the region to be formed into art element isolating region and is removed from on the region where a vertical transfer channel and a horizontal transfer channel are to be formed. Thereafter, a p-type region 324 is formed by implanting ions of p-type impurities such as boron into the surface layer portion of the n$^{---}$-type semiconductor substrate 302, and an n-type region 325 is formed by implanting ions of n-type impurities such as phosphorus or arsenic into the surface layer portion of the p-type region 324.

Figure 16A:
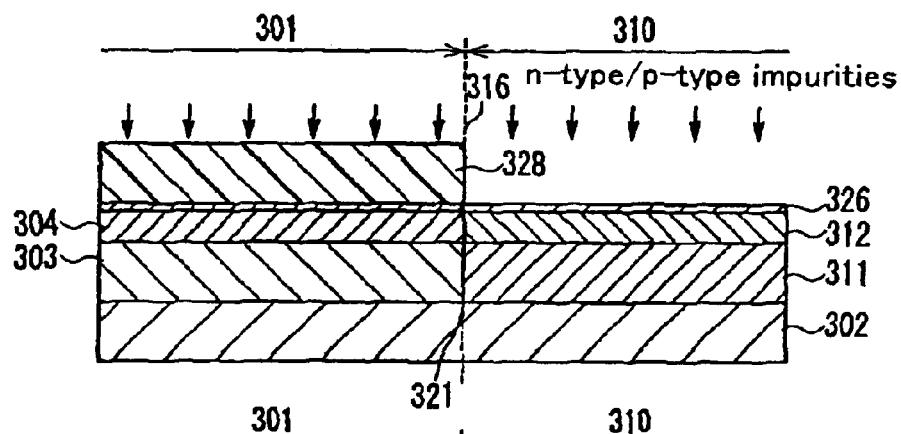
FIGS. 16A and 16B are schematic views illustrating the third example of the method for producing the solid-state imaging device of the first embodiment.
Figure 16B:
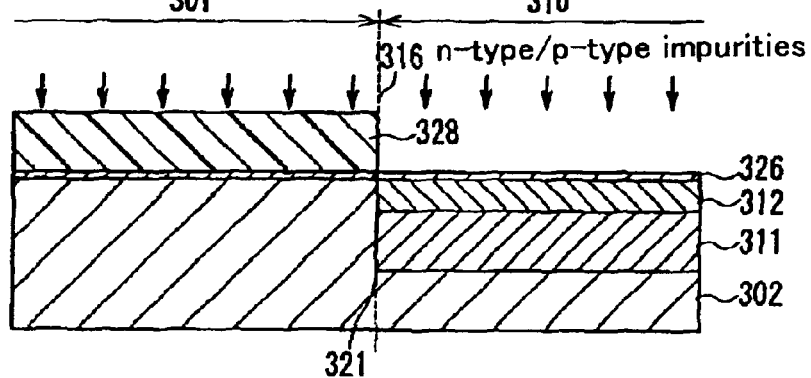

Then, the first photoresist film 334 is removed entirely, and a second photoresist film 328 is formed on the surface of the protective film 326. As shown in FIGS. 16A and 168, the second photoresist film 328 is patterned and removed such that the second photoresist film 328 is left on the regions to be farmed into an element isolating region and a vertical channel region, and is removed from the region where a horizontal transfer channel is to be formed. Using as a mask the second photoresist film 328 that is left, a horizontal p-type well 311 having a low concentration is formed by implanting ions of n-type impurities such as phosphorus or arsenic in substantially the same depth as the p-type region 324, and a horizontal transfer channel 312 having a low concentration is formed by implanting ions of p-type impurities such as boron in substantially the same depth as the n-type region 325. The portions of the p-type region 324 and the n-type region 325 in which the horizontal p-type well 311 and the horizontal transfer channel 312 are not formed serve as a vertical p-type well 303 and a vertical transfer channel 304, respectively.

At this point, the shift between the positions of the boundary between the vertical transfer channel and the horizontal transfer channel (the end portion 321 of the vertical transfer channel on the side of the horizontal charge transferring portion) and the boundary between the vertical p-type well and the horizontal p-type well (the end portion 337 of the vertical p-type well on the side of the horizontal charge transferring portion), and the position of the end portion of the region to be formed into the p$^+$-type element isolating region 305 on the side of the horizontal charge transferring portion (corresponding to reference numeral 316 of FIG. 17B) is adjusted so as to be within 1.5 μm.

Figure 17A:
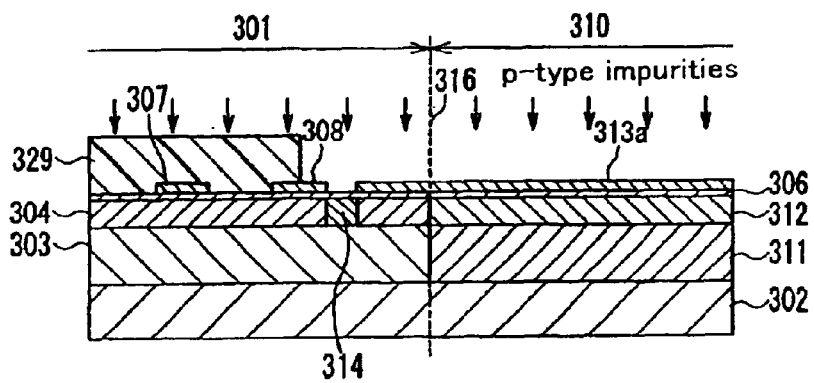
FIGS. 17A and 17B are schematic views illustrating the third example of the method for producing the solid-state imaging device of the first embodiment.
Figure 17B:
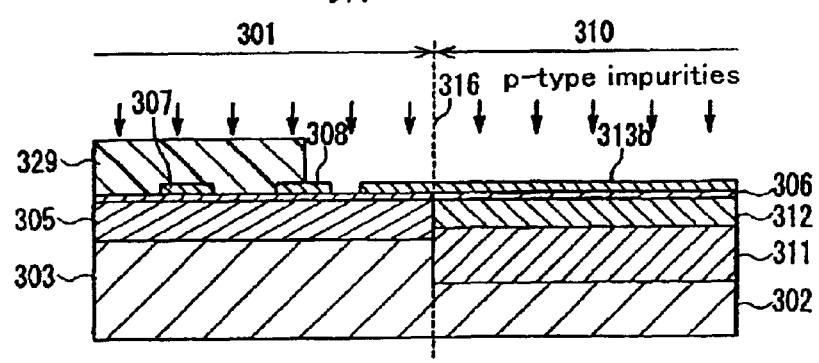

Then, after the second photoresist film 328 is removed entirely, as shown in FIGS. 17A and 17B, the element isolating region 305 is formed by implanting ions of p-type impurities such as boron into the region other than the vertical transfer channel and the horizontal transfer channel of the surface layer portion of the n$^{---}$-type semiconductor substrate 302. After the protective film 326 is removed entirely, a gate insulating film 306 is formed on the surface, and transfer electrodes 307, 308, 313a, and 313b of the first layer are formed on the gate insulating film 306. Furthermore, a third photoresist film 329 is formed on the surface and then removed from the region on the side of the horizontal transfer channel so as to have the end portion on the final vertical transfer electrode 308. Thereafter, art n$^-$-type potential barrier region 314 is formed by implanting ions of p-type impurities such as boron.

Figure 18A:
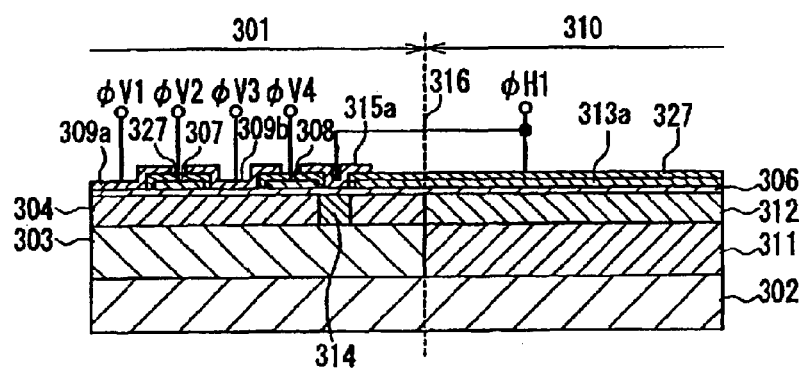
FIGS. 18A and 18B are schematic views illustrating the third example of the method for producing the solid-state imaging device of the first embodiment.
Figure 18B:
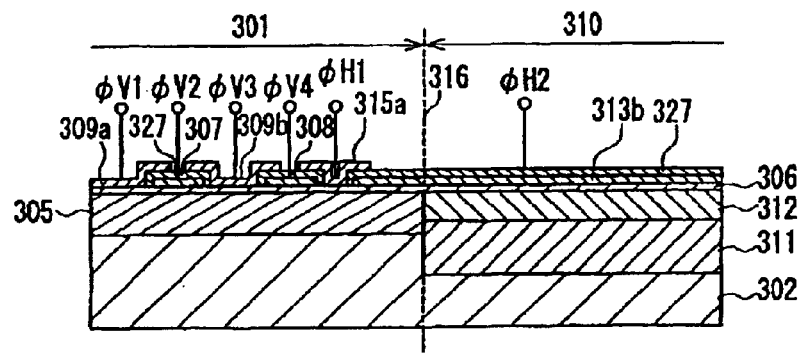
Figures 19A, 19B:
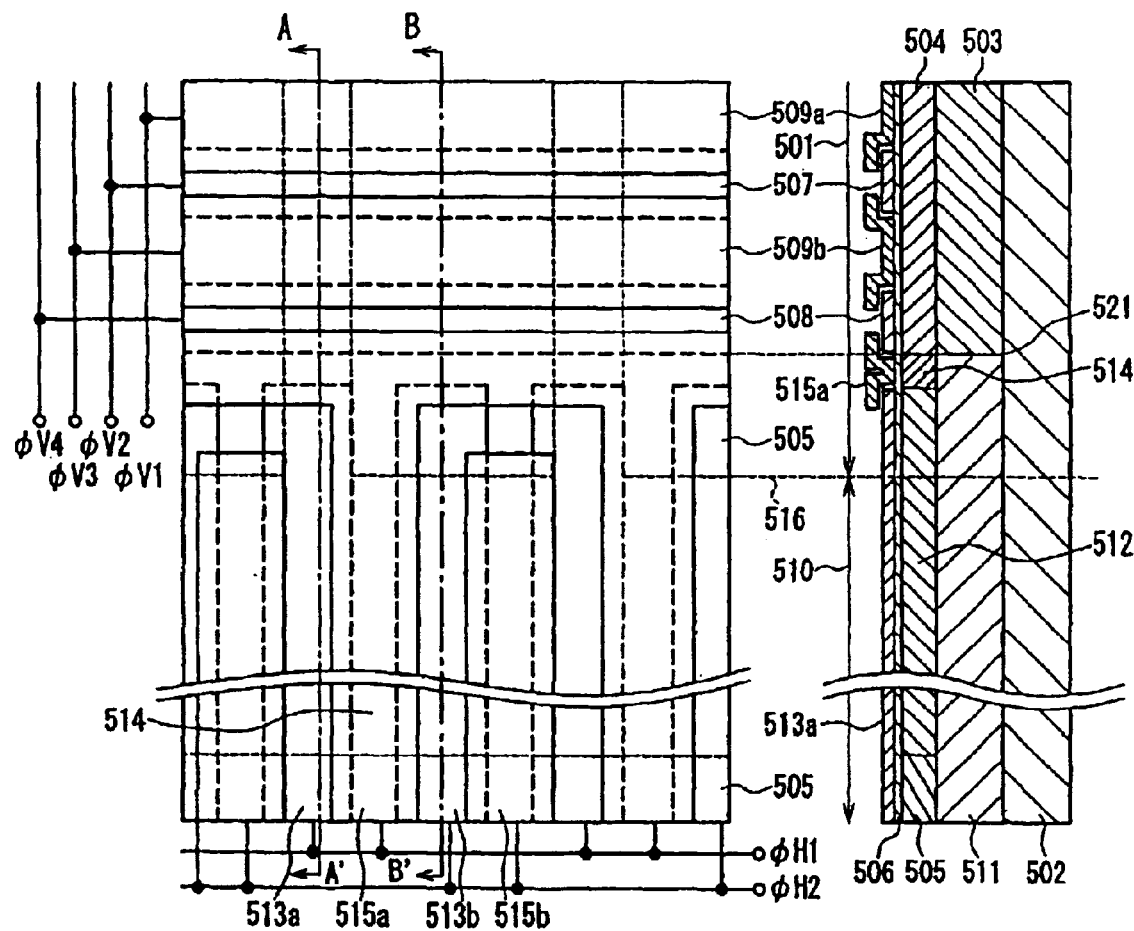
FIGS. 19A and 19B are schematic views showing the structure in the vicinity of the connection portion between the vertical charge transferring portion and the horizontal charge transferring portion in a conventional solid-state imaging device.

Then, after the third photoresist film 329 is removed entirely, as shown in FIGS. 18A and 18B, an interlayer insulating film 327 is formed around the transfer electrodes 307, 308, 313a, and 313b of the first layer, and transfer electrodes 309a, 309b, 315a, and 315b of the second layer are formed. Wiring is performed with metal films such as aluminum or tungsten such that the clock pulses φV1, φV2, φV3, and φV4 are applied to the vertical transfer electrodes 309a, 307, 309b, and 308, respectively, and the clock pulses φH1 and φH2 are applied to a pair of horizontal transfer electrodes 313a and 315a and a pair of horizontal transfer electrodes 313b and 315b, respectively. Thus, the solid-state imaging device of the first embodiment is produced.

Next, the effects achieved by this method for producing a solid-state imaging device will be described with reference to FIGS. 15A and 15B. In this production method, as described above, the vertical transfer channel 304 and the vertical p-type well 303 are formed by only one operation of ion implantation of n-type impurities and p-type impurities, respectively, using as a mask the first photoresist film 334 that has been patterned and removed [FIGS. 15A and 15B], and therefore a positional shift in the horizontal direction or a width spread of the implanted region between the first and the second ion implantation is not caused by the first and the second ion implantation for forming the vertical transfer channel and the vertical p-type well, and the width of the regions where the vertical transfer channel 304 and the vertical p-type well 303 are formed becomes stable. As a result, even if the miniaturization of pixels is promoted, a variation in the amount of transfer charges in the vertical charge transferring portion and poor transfer of signal charges from the vertical charge transferring portion to the horizontal charge transferring portion can be suppressed.

Furthermore, in the method for producing a solid-state imaging device of the fourth embodiment, unlike the production methods of the second and the third embodiments, there is no need for forming the ion implantation blocking film, and therefore it is possible to shorten the production process. Furthermore, etching damage caused by patterning and removing the ion implantation blocking film, or a variation in the amount of ion implantation caused by varied films that are left can be suppressed, so that a solid-state imaging device having a low dark current and a small variation in the amount of transfer charge can be achieved.

In the first to fourth embodiments, the p-type impurity concentration is different between the vertical p-type well and the horizontal p-type well, but this is illustrative, and the two p-type wells may have the same impurity concentration.

In addition, the horizontal transfer channel is formed in substantially the same depth as that of the vertical transfer channel, but this is illustrative, and the horizontal transfer channel may be formed deeper than the vertical transfer channel.

Furthermore, in the connection portion between the vertical charge transferring portion and the horizontal charge transferring portion, the potential barrier region is formed in a region corresponding to a gap between the final vertical transfer electrode and the first horizontal transfer electrode, but this is illustrative and no potential barrier region may be formed.

Furthermore, the vertical charge transferring portion and the horizontal charge transferring portion include transfer electrodes having a two layered structure, but the present invention is not limited thereto. For example, the transfer electrodes have a single layer structure or a multilayer structure including three or more layers.

The present invention has been described by taking as an example an interline-transfer solid-state imaging device having a horizontal charge transferring portion electrically connected to one end of vertical charge transferring portions. However, the present invention is not limited thereto, and for example, the present invention also can apply to solid-state imaging devices having other systems such as a frame transfer type or solid-state imaging devices having horizontal charge transferring portions electrically connected to both ends of vertical charge transferring portions.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device comprising a plurality of vertical charge transferring portions, and a horizontal charge transferring portion that is connected to at least one end of the vertical charge transferring portions, receives charges transferred from the vertical charge transferring portions and transfers the charges, wherein each of the vertical charge transferring portions includes a vertical transfer channel region of a first conductivity, an element isolating region of a second conductivity formed so as to be adjacent to the vertical transfer channel region of the first conductivity, a plurality of vertical transfer electrodes and a final vertical transfer electrode formed on the vertical transfer channel region of the first conductivity, and a vertical well region of the second conductivity formed below the vertical transfer channel region of the first conductivity, the horizontal charge transferring portion includes a horizontal transfer channel region of a first conductivity, and a plurality of horizontal transfer electrodes formed on the horizontal transfer channel region of the first conductivity, and a horizontal well region of the second conductivity formed below the horizontal transfer channel region of the first conductivity, in a connection portion between each of the vertical charge transferring portions and the horizontal charge transferring portion, the vertical transfer channel region of the first conductivity, the element isolating region of the second conductivity and the vertical well region of the second conductivity extend from each of the vertical charge transferring portions, and a part of the horizontal transfer electrodes is overlapped on a portion of the vertical transfer channel region of the first conductivity that extends in the connection portion, and end portions of the portions of the vertical transfer channel region of the first conductivity and the vertical well region of the second conductivity that extend in the connection portion on the side of the horizontal charge transferring portion are positioned more on the side of the horizontal charge transferring portion than an end portion of the final vertical transfer electrode on the side of the horizontal charge transferring portion, and are positioned within 1.5 $\mu$m from the end portion of the element isolating region of the second conductivity on the side of the horizontal charge transferring portion.

2. The solid-state imaging device according to claim 1, wherein the horizontal transfer channel region of the first conductivity is formed so as to have a lower impurity concentration than that of the vertical transfer channel region of the first conductivity.

3. The solid-state imaging device according to claim 1, wherein the horizontal transfer channel region of the first conductivity is formed so as to have a larger diffusion depth than that of the vertical transfer channel region of the first conductivity.

4. The solid-state imaging device according to claim 1, wherein the horizontal well region of the second conductivity is formed so as to have a lower impurity concentration than that of the vertical well region of the second conductivity.

5. The solid-state imaging device according to claim 1, wherein the horizontal well region of the second conductivity is formed so as to have a larger diffusion depth than that of the vertical well region of the second conductivity.

6. The solid-state imaging device according to claim 1, wherein the impurity concentrations of the vertical transfer channel region of the first conductivity and the horizontal transfer channel region of the first conductivity are set such that, with respect to the horizontal transfer electrodes arranged so as to overlap the vertical transfer channel region of the first conductivity in the connection portion, a channel potential of the horizontal transfer channel region of the first conductivity positioned below the horizontal transfer electrodes is deeper than that of the vertical transfer channel region of the first conductivity positioned below the horizontal transfer electrodes.

7. A method for producing the solid-state imaging device according to claim 1, comprising:

forming an ion implantation blocking film on a semiconductor substrate;

forming a first photoresist film on the ion implantation blocking film;

patterning the first photoresist film and the ion implantation blocking film such that the first photoresist film and the ion implantation blocking film are left on a region to be formed into an element isolating region of a second conductivity and are removed from a region to be formed into a vertical transfer channel region of a first conductivity and a horizontal transfer channel region of the first conductivity;

forming the vertical transfer channel region of the first conductivity and the horizontal transfer channel region of the first conductivity by implanting ions of impurities of the first conductivity in a surface layer of the semiconductor substrate, and forming a vertical well region of the second conductivity and a horizontal well region of the second conductivity by implanting ions of impurities of the second conductivity below the vertical transfer channel region of the first conductivity and the horizontal transfer channel region of the first conductivity, using the first photoresist film and the ion implantation blocking film as a mask;

removing the first photoresist film and then forming a second photoresist on the semiconductor substrate;

patterning the second photoresist film such that the second photoresist is left on the horizontal transfer channel region of the first conductivity and removed from the vertical transfer channel region of the first conductivity; and implanting further ions of impurities of the first conductivity in the vertical transfer channel region of the first conductivity, using the second photoresist film and the ion implantation blocking film as a mask.

8. A method for producing the solid-state imaging device according to claim 1, comprising:

forming an ion implantation blocking film on a semiconductor substrate;

forming a first photoresist film on the ion implantation blocking film;

patterning the first photoresist film and the ion implantation blocking film such that the first photoresist film and the ion implantation blocking film are left on a region to be formed into an element isolating region of a second conductivity and are removed from a region to be formed into a vertical transfer channel region of a first conductivity and a horizontal transfer channel region of the first conductivity;

forming the vertical transfer channel region of the first conductivity and the horizontal transfer channel region of the first conductivity by implanting ions of impurities of the first conductivity in a surface layer of the semiconductor substrate using the first photoresist film and the ion implantation blocking film as a mask, removing the first photoresist film and then forming a second photoresist film on the semiconductor substrate;

patterning the second photoresist film such that the second photoresist is left on the horizontal transfer channel region of the first conductivity and removed from at least on the vertical transfer channel region of the first conductivity;

forming a vertical well region of the second conductivity by implanting further ions of impurities of the first conductivity in the vertical transfer channel region and implanting ions of impurities of the second conductivity below the vertical transfer channel region, using the second photoresist film and the ion implantation blocking film as a mask;

removing the second photoresist film and the ion implantation blocking film and then forming a third photoresist film on the semiconductor substrate;

patterning the third photoresist film such that the third photoresist film is left at least on the vertical transfer channel region of the first conductivity and removed from the horizontal transfer channel region of the first conductivity; and forming a vertical well region of the second conductivity by implanting ions of impurities of the second conductivity below the horizontal transfer channel regions using the third photoresist film as a mask.

9. A method for producing the solid-state imaging device according to claim 1, comprising:

forming a first photoresist film on a semiconductor substrate;

patterning the first photoresist film such that the first photoresist film is left on a region to be formed into an element isolating region of a second conductivity and is removed from a region to be formed into a vertical transfer channel region of a first conductivity and a horizontal transfer channel region of the first conductivity;

forming the vertical transfer channel region of the first conductivity and the horizontal transfer channel region of the first conductivity by implanting ions of impurities of the first conductivity in a surface layer of the semiconductor substrate using the first photoresist film as a mask, and forming a vertical well region of the second conductivity and a horizontal well region of the second conductivity by implanting ions of impurities of the second conductivity below the vertical transfer channel region of the first conductivity and the horizontal transfer channel region of the first conductivity;

removing the first photoresist film and then forming a second photoresist film on the semiconductor substrate;

patterning the second photoresist film such that the second photoresist is left on a region to be formed into an element isolating region of the second conductivity and the vertical transfer channel region of the first conductivity and is removed from the horizontal transfer channel region of the first conductivity; and implanting further ions of impurities of the second conductivity in the horizontal transfer channel region of the first conductivity, using the second photoresist film as a mask.

10. The method for producing the solid-state imaging device according to claim 9, further comprising implanting ions of impurities of the first conductivity in the horizontal well region of the second conductivity, using the second photoresist film as a mask.

* * * * *